United States Patent
Iwai et al.

(10) Patent No.: US 11,217,514 B2
(45) Date of Patent: Jan. 4, 2022

(54) POWER SEMICONDUCTOR DEVICE, METHOD FOR MANUFACTURING POWER SEMICONDUCTOR DEVICE, AND POWER CONVERSION DEVICE

(71) Applicant: Mitsubishi Electric Corporation, Tokyo (JP)

(72) Inventors: Takamasa Iwai, Tokyo (JP); Shingo Sudo, Tokyo (JP); Yuichiro Suzuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/982,663

(22) PCT Filed: Apr. 19, 2019

(86) PCT No.: PCT/JP2019/016767
§ 371 (c)(1),
(2) Date: Sep. 21, 2020

(87) PCT Pub. No.: WO2019/216160
PCT Pub. Date: Nov. 14, 2019

(65) Prior Publication Data
US 2021/0020551 A1 Jan. 21, 2021

(30) Foreign Application Priority Data

May 9, 2018 (JP) .............................. JP2018-090487

(51) Int. Cl.
*H01L 23/495* (2006.01)
*H01L 21/48* (2006.01)
(Continued)

(52) U.S. Cl.
CPC .... *H01L 23/49568* (2013.01); *H01L 21/4825* (2013.01); *H01L 21/565* (2013.01);
(Continued)

(58) Field of Classification Search
CPC .......... H01L 23/49568; H01L 23/4952; H01L 23/49513; H01L 23/49562; H01L 23/49575; H01L 21/4825; H01L 21/565
See application file for complete search history.

(56) References Cited

U.S. PATENT DOCUMENTS 6,075,283 A * 6/2000 Kinsman ........... H01L 23/49551
257/676
2010/0127399 A1* 5/2010 Uehara ................... H01L 24/82
257/773
(Continued)

FOREIGN PATENT DOCUMENTS

JP S638414 A 1/1988
JP H05102373 A 4/1993
(Continued)

OTHER PUBLICATIONS

International Search Report (PCT/ISA/210), with translation, and Written Opinion (PCT/ISA/237) dated Jul. 9, 2020, by the Japan Patent Office as the International Searching Authority for International Application No. PCT/JP2019/016767.

*Primary Examiner* — Marc Anthony Armand
(74) *Attorney, Agent, or Firm* — Buchanan Ingersoll & Rooney PC

(57) ABSTRACT

In a power semiconductor device, power semiconductor elements are mounted on a large die pad and the like. The large die pad is joined to a power lead via a lead stepped portion. The large die pad has a first end portion and a second end portion located with a distance therebetween in the X axis direction. In the Y axis direction, the lead stepped portion is joined to the first end portion side relative to a central line between the first end portion and the second end portion. The large die pad is inclined such that a distance (Continued)

between the large die pad and the first main surface of the molding resin is longer from the first end portion toward the second end portion.

18 Claims, 20 Drawing Sheets

(51) Int. Cl.
H01L 21/56 (2006.01)
H01L 23/31 (2006.01)
H02P 27/08 (2006.01)

(52) U.S. Cl.
CPC ...... *H01L 23/3107* (2013.01); *H01L 23/4952* (2013.01); *H01L 23/49513* (2013.01); *H01L 23/49562* (2013.01); *H01L 23/49575* (2013.01); *H02P 27/08* (2013.01)

(56) References Cited

U.S. PATENT DOCUMENTS

| | | | |
|---|---|---|---|
| 2013/0320496 A1 | 12/2013 | Nishijima et al. | |
| 2019/0043788 A1 | 2/2019 | Iwai et al. | |

FOREIGN PATENT DOCUMENTS

| | | |
|---|---|---|
| JP | H08153845 A | 6/1996 |
| JP | 2014033093 A | 2/2014 |
| JP | 2016129257 A | 7/2016 |
| WO | 2012120568 A1 | 9/2012 |
| WO | 2017138072 A1 | 8/2017 |

* cited by examiner

POWER SEMICONDUCTOR DEVICE, METHOD FOR MANUFACTURING POWER SEMICONDUCTOR DEVICE, AND POWER CONVERSION DEVICE

TECHNICAL FIELD

The present invention relates to a power semiconductor device, a method for manufacturing the power semiconductor device, and a power conversion device. Particularly, the present invention relates to: a power semiconductor device including a lead frame having a die pad on which a semiconductor element is mounted; a method for manufacturing the power semiconductor device; and a power conversion device to which the power semiconductor device is applied.

BACKGROUND ART

Power semiconductor devices have become pervasive in various products from industrial devices to household appliances and information terminals. A module mounted on a household appliance has been particularly required to be downsized. A power semiconductor device generates a large amount of heat because the power semiconductor device handles high voltage and a large amount of current. In order to supply a specified amount of current, heat needs to be dissipated efficiently to outside and an electric insulation property for the outside needs to be maintained.

Examples of the power semiconductor devices include a power semiconductor device in which a lead frame including a die pad on which a power semiconductor element and the like are mounted is sealed together with the power semiconductor element and the like by a sealing material. This type of power semiconductor device is disclosed in Patent Literature 1 and Patent Literature 2, for example.

CITATION LIST

Patent Literature

PTL 1: Japanese Patent Laying-Open No. 2014-33093
PTL 2: Japanese Patent Laying-Open No. 63-8414

SUMMARY OF INVENTION

Technical Problem

In this type of power semiconductor device, the power semiconductor element and the like are sealed by the sealing material in the following manner: the lead frame including the die pad on which the power semiconductor element and the like are mounted is disposed within a mold, and then the sealing material is introduced into the mold. This method is referred to as a "transfer mold method".

In this transfer mold method, the die pad may be changed in orientation due to the sealing material when introducing the sealing material into the mold. Accordingly, depending on a manner of the change in orientation of the die pad, the thickness of the sealing material covering the die pad may become thin. When the thickness of the sealing material covering the die pad on which the power semiconductor element and the like are mounted becomes thin, the electric insulation property may be deteriorated.

The present invention has been made to solve the above-described problem, and has one object to provide a power semiconductor device in which an electric insulation property is secured, has another object to provide a method for manufacturing such a power semiconductor device, and has still another object to provide a power conversion device to which such a power semiconductor device is applied.

Solution to Problem

A power semiconductor device according to the present invention includes a lead terminal, a first die pad, a first semiconductor element, a first hanging lead, and a sealing material. The first semiconductor element is mounted on the first die pad. The first hanging lead is connected to the first die pad and is joined to the lead terminal. The sealing material seals the first die pad, the first semiconductor element, and the first hanging lead so as to expose a portion of the lead terminal. The first die pad has a first end portion and a second end portion located with a first distance between the first end portion and the second end portion in a first direction. In a second direction crossing the first direction, the first hanging lead is connected to the first die pad on the first end portion side relative to a center between the first end portion and the second end portion in the first die pad. The first die pad is disposed on a side on which a first main surface of the sealing material is located relative to a first location in a third direction, the first main surface covering a side of the first die pad opposite to a side of the first die pad on which the first semiconductor element is mounted, the third direction crossing the first direction and the second direction, the first location being a location at which the lead terminal is located. The first die pad is inclined such that a thickness of the sealing material from a portion of the sealing material on the side of the first die pad opposite to the side of the first die pad on which the first semiconductor element is mounted to the first main surface is thicker from the first end portion side of the first die pad toward the second end portion side of the first die pad.

One method for manufacturing a power semiconductor device according to the present invention includes the following steps. A lead frame is formed. A first semiconductor element is mounted on the lead frame. The lead frame is disposed in a mold such that a side of the lead frame on which the first semiconductor element is mounted orients upward, the mold being provided with a lower mold, an upper mold, and a sealing material introduction opening. A sealing material is introduced from the sealing material introduction opening into the mold. The mold is removed. The forming of the lead frame includes: forming a lead terminal, a first die pad, and a first hanging lead, the first die pad having a first end portion and a second end portion located with a first distance between the first end portion and the second end portion in a first direction, the first semiconductor element being mounted on the first die pad, in a second direction crossing the first direction, the first hanging lead being connected to the first die pad on the first end portion side relative to a center between the first end portion and the second end portion in the first die pad, the first hanging lead being joined to the lead terminal; and disposing the first die pad at a location lower than a first location in a third direction by performing a bending process onto the first hanging lead, the first location being a location at which the lead terminal is located, the third direction crossing the first direction and the second direction. In the disposing of the lead frame in the mold, the sealing material introduction opening is disposed below the first location at a location from which the sealing material is introduced toward the first hanging lead in the first direction. In the introducing of the sealing material into the mold, the sealing material introduced from the sealing material introduction opening into the mold includes a first sealing material portion provided between the first die pad and the lower mold, and a second sealing material portion provided between the first die pad and the upper mold, when providing the first sealing material portion and the second sealing material portion, the first die pad is inclined such that the second end portion side of the first die pad orients upward relative to the first end portion side of the first die pad due to the second end portion side of the first die pad being pushed up by the first sealing material portion relative to the first end portion side of the first die pad, the first hanging lead being connected to the first end portion side of the first die pad.

Another method for manufacturing a power semiconductor device according to the present invention includes the following steps. A lead frame is formed. A first semiconductor element is mounted on the lead frame. The lead frame is disposed in a mold such that a side of the lead frame on which the first semiconductor element is mounted orients upward, the mold being provided with a lower mold, an upper mold, and a sealing material introduction opening. A sealing material is introduced from the sealing material introduction opening into the mold. The mold is removed. The forming of the lead frame includes: forming a lead terminal, a first die pad, and a first hanging lead, the first die pad having a first end portion and a second end portion located with a first distance between the first end portion and the second end portion in the first direction, the first semiconductor element being mounted on the first die pad, in a second direction crossing the first direction, the first hanging lead being connected to the first die pad on the first end portion side relative to a center between the first end portion and the second end portion in the first die pad, the first hanging lead being joined to the lead terminal; and disposing the first die pad at a location lower than a first location in a third direction by performing a bending process onto the first hanging lead, the first location being a location at which the lead terminal is located, the third direction crossing the first direction and the second direction. In the disposing of the lead frame in the mold, the sealing material introduction opening is disposed below the first location at a location from which the sealing material is introduced toward the first hanging lead in the first direction. The forming of the lead frame includes forming a first protruding lead that protrudes from the lead terminal in the second direction and that is disposed on the first end portion side of the first die pad relative to the first hanging lead. In the introducing of the sealing material into the mold, when seen in the first direction, the sealing material is introduced from the sealing material introduction opening disposed below the first protruding lead.

A power conversion device according to the present invention includes: a main conversion circuit to convert input power and output the converted power, the main conversion circuit having the above-described power semiconductor device; and a control circuit to output, to the main conversion circuit, a control signal for controlling the main conversion circuit.

Advantageous Effects of Invention

According to the power semiconductor device according to the present invention, the first die pad on which the first semiconductor element is mounted is inclined such that the thickness of the sealing material from the portion of the sealing material on the side of the first die pad opposite to the side of the first die pad on which the first semiconductor element is mounted to the first main surface is thicker from the first end portion side of the first die pad toward the second end portion side of the first die pad. Accordingly, an electric insulation property in the power semiconductor device can be secured.

According to the one method for manufacturing the power semiconductor device according to the present invention, when providing the first sealing material portion and the second sealing material portion, the first die pad is inclined such that the second end portion side of the first die pad orients upward relative to the first end portion side of the first die pad due to the second end portion side of the first die pad being pushed up by the first sealing material portion relative to the first end portion side of the first die pad, the first hanging lead being connected to the first end portion side of the first die pad. Accordingly, there can be manufactured a power semiconductor device in which an electric insulation property can be secured.

According to the other method for manufacturing the power semiconductor device according to the present invention, in the introducing of the sealing material into the mold, the sealing material is introduced from the sealing material introduction opening disposed below the first protruding lead when seen in the first direction. Accordingly, there can be manufactured a power semiconductor device in which an electric insulation property can be secured.

According to the power conversion device according to the present invention, a power conversion device having a high insulation property can be obtained by applying the above-described power semiconductor device.

DESCRIPTION OF EMBODIMENTS

First Embodiment

Figure 1:
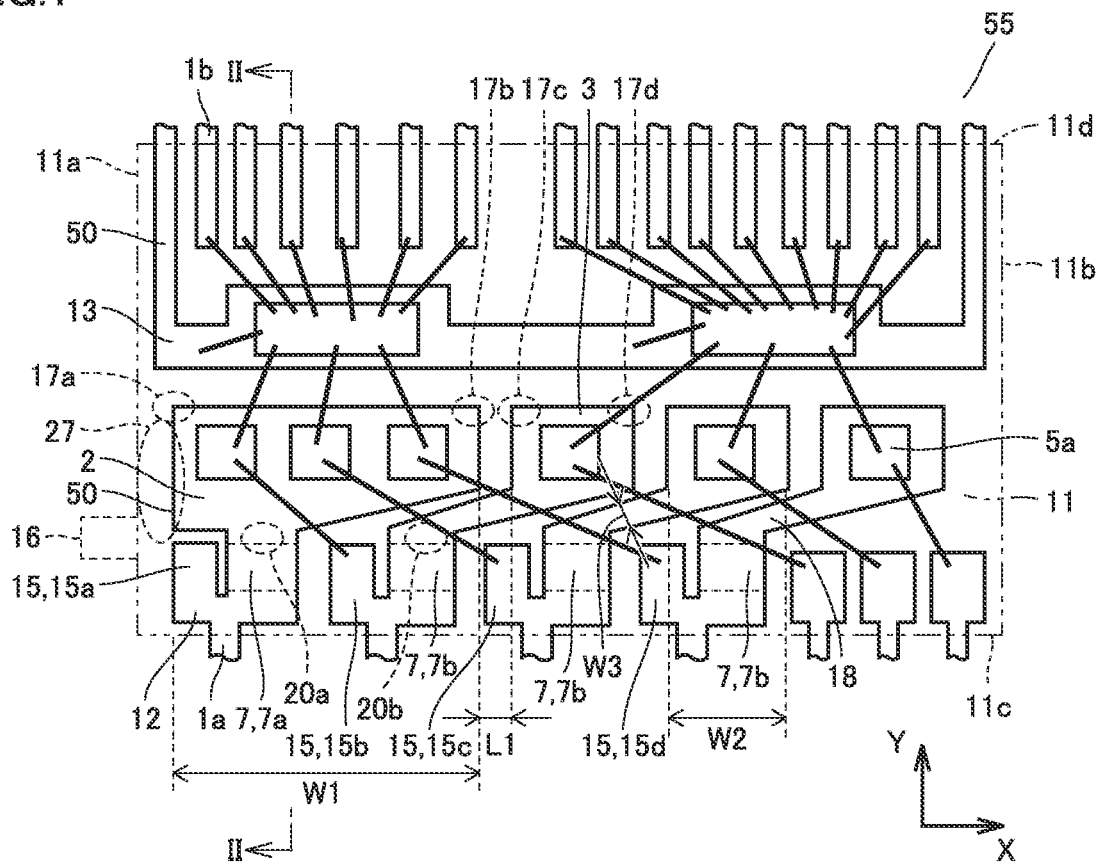
FIG. 1 is a plan view of a power semiconductor device according to a first embodiment of the present invention.
Figure 2:
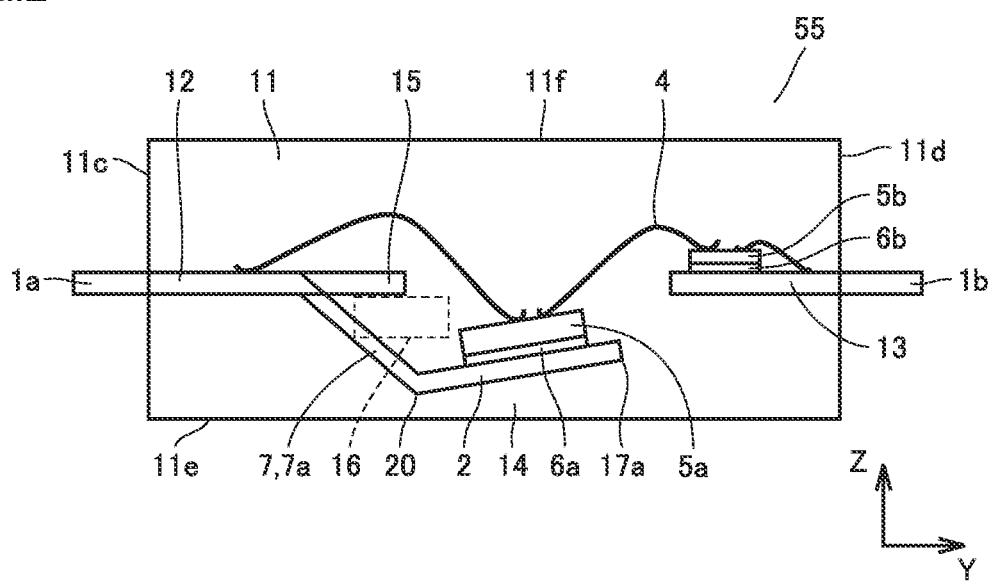
FIG. 2 is a cross sectional view along a cross sectional line II-II shown in FIG. 1 in the embodiment.

A power semiconductor device according to a first embodiment will be described. As shown in FIG. 1 and FIG. 2, as a lead frame 50, a power semiconductor device 55 includes a power lead terminal 1a, a power lead 12, a large die pad 2, small die pads 3, lead stepped portions 7 (7a, 7b), protruding leads 15 (15a, 15b, 15c, 15d), IC lead terminals 1b, and an IC lead 13.

Here, power lead terminal 1a corresponds to a lead terminal. Large die pad 2 corresponds to a first die pad. Each of small die pads 3 corresponds to a second die pad. Lead stepped portion 7a of lead stepped portions 7 corresponds to a first hanging lead. Lead stepped portion 7b corresponds to a second hanging lead. Protruding lead 15a of protruding leads 15 corresponds to a first protruding lead. Each of protruding leads 15b, 15c, 15d corresponds to a second protruding lead. IC lead 13 corresponds to a third die pad.

Power semiconductor elements 5a each serving as a first semiconductor element are mounted on large die pad 2. A power semiconductor element 5a serving as a second semiconductor element is mounted on small die pad 3. Three power semiconductor elements 5a are mounted on large die pad 2. Each of three power semiconductor elements 5a is bonded to large die pad 2 by an electrically conductive adhesive agent 6a. One power semiconductor element 5a is mounted on small die pad 3. One power semiconductor element 5a is bonded to small die pad 3 by electrically conductive adhesive agent 6a. Each power semiconductor element 5a is an IGBT (Insulated Gate Bipolar Transistor), a MOSFET (Metal-Oxide-Semiconductor Field-Effect Transistor), or the like, for example. As electrically conductive adhesive agent 6a, a solder, a silver paste, or the like is applied, for example.

IC elements 5b each serving as a third semiconductor element are mounted on IC lead 13. Each of IC elements 5b is bonded to IC lead 13 by an electrically conductive adhesive agent 6b. Corresponding power semiconductor elements 5a and IC elements 5b are electrically connected by wires 4. Corresponding power semiconductor elements 5a and protruding leads 15a to 15d are electrically connected by wires 4. Corresponding IC elements 5b and IC lead terminals 1b are electrically connected by wires 4. Each of wires 4 is composed of a metal such as gold or silver, for example. In this way, an electrical circuit is formed on lead frame 50. It should be noted that the material, thickness, or the like of wire 4 may be appropriately changed depending on a portion to which wire 4 is connected. Moreover, the portion to which wire 4 is connected may be subjected to a process for increasing bonding force of the wire, such as coating.

Lead frame 50, power semiconductor elements 5a, and IC elements 5b are sealed by a molding resin 11 serving as a sealing material. Power lead terminal 1a protrudes from molding resin 11 with its portion joined to power lead 12 being sealed by molding resin 11. Each of IC lead terminals 1b protrudes from molding resin 11 with its portion joined to IC lead 13 being sealed by molding resin 11.

Molding resin 11 has a first side portion 11a, a second side portion 11b, a third side portion 11c, a fourth side portion 11d, a first main surface 11e, and a second main surface 11f. First side portion 11a and second side portion 11b face each other with a space therebetween in the X axis direction, and extend in the Y axis direction. Third side portion 11c and fourth side portion 11d face each other with a space therebetween in the Y axis direction, and extend in the X axis direction. First main surface 11e and second main surface 11f face each other with a space therebetween in the Z axis direction. It should be noted that FIG. 1 shows the location of a resin introduction opening 16 from which a flowable resin to serve as molding resin 11 is introduced. An arrangement relation of resin introduction opening 16 will be described later.

The following describes structures of large die pad 2, small die pad 3, and the like. As shown in FIG. 2, each of large die pad 2 and small die pad 3 is disposed at a location lower than the location (height) of power lead terminal 1a (IC lead terminal 1b), which is sealed by molding resin 11, in the Z axis direction. That is, each of large die pad 2 and small die pad 3 is disposed on the first main surface 11e side of molding resin 11 relative to the location of power lead terminal 1a (IC lead terminal 1b) in the Z axis direction. It should be noted that IC lead 13 on which IC elements 5b are mounted is disposed on the second main surface 11f side of molding resin 11 relative to each of large die pad 2 and small die pad 3.

Figure 3:
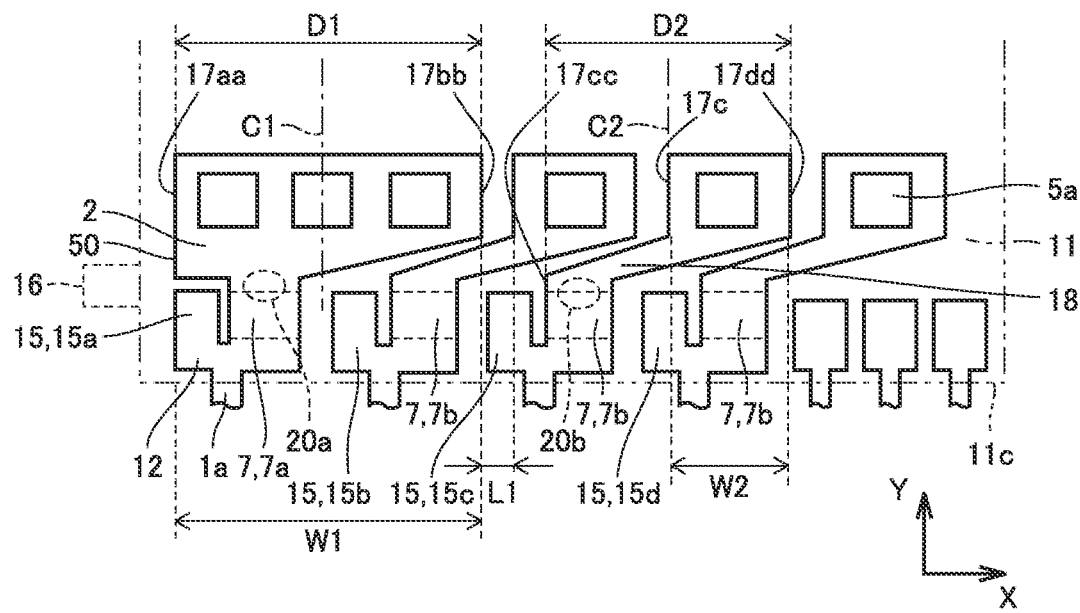
FIG. 3 is a partial plan view for illustrating an arrangement relation between a large die pad and a small die pad in the embodiment.

As shown in FIG. 1 and FIG. 3, large die pad 2 is joined to power lead 12 via lead stepped portion 7a. Large die pad 2 has a first end portion 17aa and a second end portion 17bb located with a distance D1 therebetween in the X axis direction serving as a first direction. In the Y axis direction serving as a second direction, lead stepped portion 7 is joined to the first end portion 17*aa* side relative to a central line C1 between first end portion 17*aa* and second end portion 17*bb*. A portion of large die pad 2 on which three power semiconductor elements 5*a* are mounted has a width W1 in the X axis direction. Width W1 serves as a first width. Each of protruding leads 15*a* to 15*d* protrudes from power lead 12 in the Y axis direction (positive direction).

Each of small die pads 3 includes a bent portion 18. Small die pad 3 is joined to power lead 12 via bent portion 18 and lead stepped portion 7 of small die pad 3. Small die pad 3 has a third end portion 17*cc* and a fourth end portion 17*dd* located with a distance D2 therebetween in the X axis direction. In the Y axis direction, lead stepped portion 7 is joined to the third end portion 17*cc* side relative to a central line C2 between third end portion 17*cc* and fourth end portion 17*dd*.

A portion of small die pad 3 on which one power semiconductor element 5*a* is mounted has a width W2 in the X axis direction. Width W2 serves as a second width. Width W2 is shorter than width W1. Bent portion 18 extends obliquely to have: an X direction component extending in the X axis direction; and a Y direction component extending in the Y axis direction. Hence, in small die pad 3, the X coordinate value of a tip 17*c* of small die pad 3 is larger than the X coordinate value of a termination portion 20*b* of lead stepped portion 7.

Bent portion 18 in small die pad 3 has a width W3 in a direction substantially orthogonal to a direction having an X direction component and a Y direction component and extending obliquely. This width W3 is shorter than the width (X axis direction) of lead stepped portion 7 and width W2 of small die pad 3. Since such a bent portion 18 is included, even when a space 27 lateral to large die pad 2 (in the negative X axis direction) is comparatively narrow, one power semiconductor element 5*a* can be mounted on each of three small die pads 3 with three power semiconductor elements 5*a* being mounted on large die pad 2. Accordingly, power semiconductor elements 5*a* can be disposed efficiently within a limited volume of power semiconductor device 55, thereby contributing to downsizing of power semiconductor device 55.

The following describes an arrangement relation between large die pad 2 and each small die pad 3 more in detail. Large die pad 2 is inclined such that a distance between large die pad 2 and first main surface 11*e* of molding resin 11 is longer from the first end portion 17*aa* side toward the second end portion 17*bb* side. That is, large die pad 2 is inclined such that the thickness of molding resin 11 (thickness of insulating layer 14) covering a side of large die pad 2 opposite to a side of large die pad 2 on which each power semiconductor element 5*a* is mounted is thicker in the positive X axis direction (see FIG. 10).

Moreover, large die pad 2 is inclined such that the thickness of the portion of molding resin 11 (thickness of insulating layer 14) covering the side of large die pad 2 opposite to the side of large die pad 2 on which power semiconductor element 5*a* is mounted is thicker than the thickness of the portion of molding resin 11 covering termination portion 20*a* of lead stepped portion 7.

Small die pad 3 is inclined such that a distance between small die pad 3 and first main surface 11*e* of molding resin 11 is longer from the third end portion 17*cc* side toward the fourth end portion 17*dd* side. That is, small die pad 3 is inclined such that the thickness of molding resin 11 (thickness of insulating layer 14) covering a side of small die pad 3 opposite to a side of small die pad 3 on which power semiconductor element 5*a* is mounted is thicker in the positive X axis direction (see FIG. 10).

Figure 4:
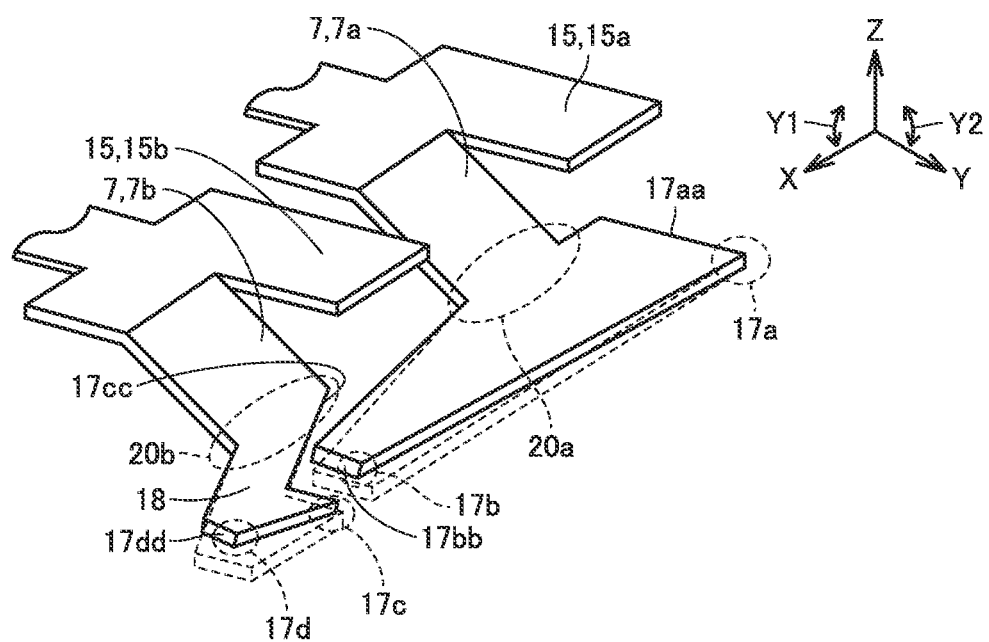
FIG. 4 is a partial perspective view for illustrating the arrangement relation between the large die pad and the small die pad in the embodiment.

The following describes the arrangement relation between large die pad 2 and small die pad 3 further in detail. FIG. 4 shows portions of large die pad 2 and small die pad 3 in an enlarged manner. As shown in FIG. 4, large die pad 2 is inclined relative to the XY plane such that the second end portion 17*bb* (tip 17*b*) side of large die pad 2 is at a higher location (Z axis direction) than the first end portion 17*aa* (tip 17*a*) side on which termination portion 20*a* of lead stepped portion 7*a* is located. That is, the portion of large die pad 2 extending from the first end portion 17*aa* side toward the second end portion 17*bb* side in the X axis direction is inclined in a direction (the positive Z axis direction) indicated by an arrow Y1.

Moreover, small die pad 3 is inclined relative to the XY plane such that the fourth end portion 17*dd* (tip 17*d*) side of small die pad 3 is at a higher location (Z axis direction) than the third end portion 17*cc* side on which termination portion 20*b* of lead stepped portion 7*b* is located. That is, the portion of small die pad 3 extending from the third end portion 17*cc* side toward the fourth end portion 17*dd* side in the X axis direction is inclined in the direction (the positive Z axis direction) indicated by arrow Y1.

Since each of large die pad 2 and small die pad 3 is inclined in this way, a distance can be secured between tip 17*b* (second end portion 17*bb*) of large die pad 2 and tip 17*c* (third end portion 17*cc*) of small die pad 3. This can contribute to downsizing of molding resin 11 while attaining an excellent electric insulation property between large die pad 2 and small die pad 3.

Further, the location of tip 17*a* of large die pad 2 is desirably located below (−z direction) the location of tip 17*c* of small die pad 3. When large die pad 2 and small die pad 3 are inclined at the same angle relative to the X-Y plane, it is readily anticipated that the location of tip 17*a* of large die pad 2 is below (−z direction) the location of tip 17*c* of small die pad 3. On this occasion, the thinnest portion of insulating layer 14 is the tip 17*a* portion of large die pad 2. Dielectric breakdown is anticipated to take place at this portion. Accordingly, locations to be inspected for insulation property can be reduced, thereby improving efficiency of the inspection. Further, since a portion to have dielectric breakdown can be anticipated in large die pad 2 and small die pad 3, dielectric voltage can be increased by performing a process to remove parts of angular portions of large die pad 2 or small die pad 3.

It should be noted that the location of tip 17*a* of large die pad 2 may be above (+z direction) the location of tip 17*c* of small die pad 3. In that case, the respective directions in which tip 17*a* of large die pad 2 and tip 17*c* of small die pad 3 are moved by the flowable resin are reversed, with the result that a space between tip 17*a* and tip 17*c* becomes large. This is preferable.

Moreover, since large die pad 2 and small die pad 3 are both inclined, the respective widths (X axis direction) of large die pad 2 and small die pad 3 can be set to be wider as long as the size of molding resin 11 is the same. Accordingly, heat generated from power semiconductor element 5*a* can be dissipated more efficiently.

Further, a portion of large die pad 2 extending in the Y axis direction from the side on which termination portion 20*a* is located toward the side further away therefrom in the Y axis direction may be inclined in a direction (positive Z axis direction) indicated by an arrow Y2. Moreover, a portion of small die pad 3 extending in the Y axis direction from the side on which termination portion 20b is located toward the side further away therefrom in the Y axis direction may be inclined in the direction (positive Z axis direction) indicated by arrow Y2.

In this case, a distance between tip 17b of large die pad 2 and tip 17c of small die pad 3 can be further secured. This can contribute to further downsizing of molding resin 11 while attaining a more excellent electric insulation property between large die pad 2 and small die pad 3.

It should be noted that in order to secure the thickness of molding resin 11 (thickness of insulating layer 14) covering the side of large die pad 2 opposite to the side of large die pad 2 on which power semiconductor element 5a is mounted, large die pad 2 and small die pad 3 may be inclined in such a manner that each of the portions of large die pad 2 and small die pad 3 extending in the Y axis direction is inclined only in the direction indicated by arrow Y2.

Next, the following describes an exemplary method for manufacturing the power semiconductor device described above. First, lead frame 50 (see FIG. 5) is formed by etching or punching of a metal plate. On lead frame 50, power lead terminals 1a, power leads 12, large die pads 2, small die pads 3, protruding leads 15a, etc., IC lead terminals 1b, IC leads 13, and dummy leads 21a, 21b are formed (see FIG. 5).

Figure 5:
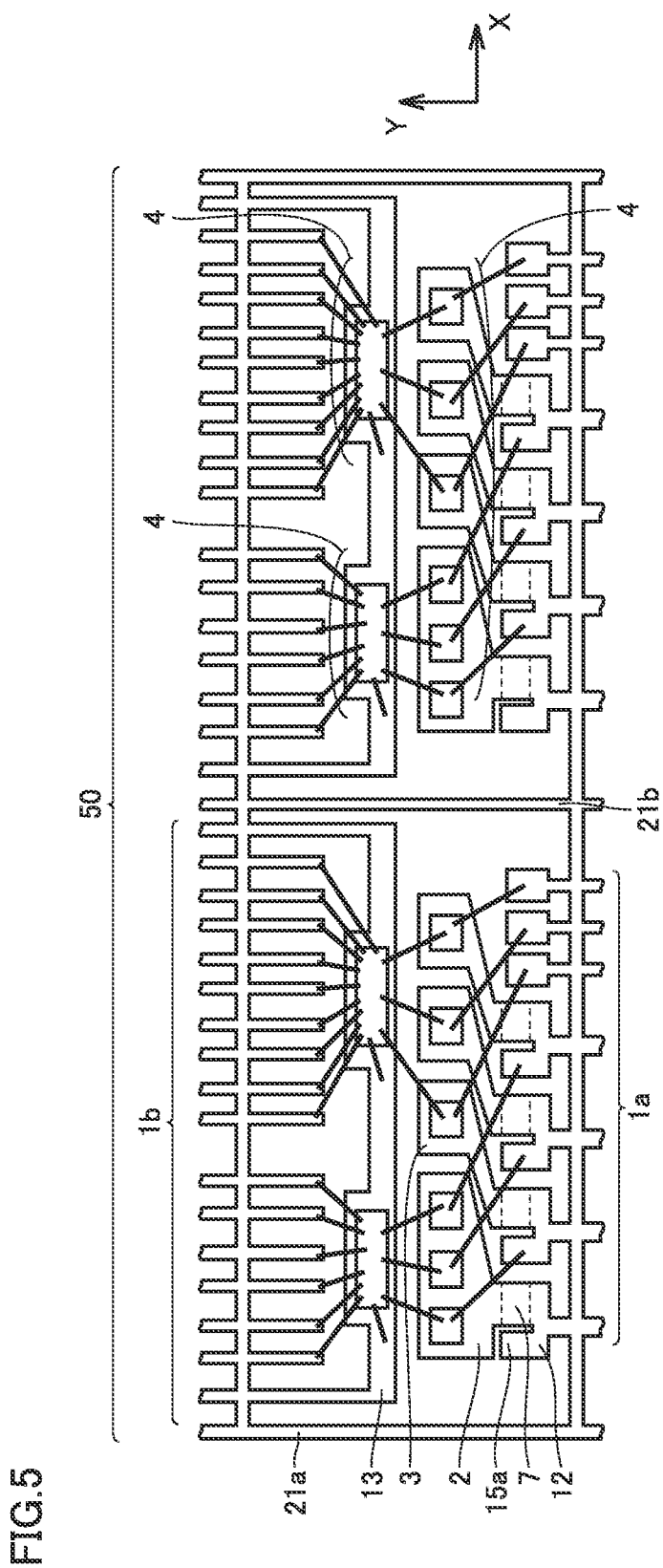
FIG. 5 is a plan view showing one step of a method for manufacturing the power semiconductor device in the embodiment.

Next, by performing a bending process onto lead frame 50 using a bending mold, lead stepped portions 7 are formed (see FIG. 5). Next, power semiconductor elements 5a are bonded to large die pads 2 and small die pads 3 by way of an electrically conductive adhesive agent (see FIG. 5). Moreover, IC elements 5b are bonded to IC leads 13 by the electrically conductive adhesive agent (see FIG. 5). Next, wires 4 are connected.

In this way, as shown in FIG. 5, a plurality of power semiconductor devices before being sealed by the molding resin is formed. The plurality of power semiconductor devices are disposed side by side in the X axis direction. One power semiconductor device and the other power semiconductor device adjacent to each other are joined to each other by dummy leads 21a, 21b. It should be noted that FIG. 5 shows two power semiconductor devices in the X axis direction; however, one power semiconductor device may be disposed or three or more power semiconductor devices may be disposed.

Figure 6:
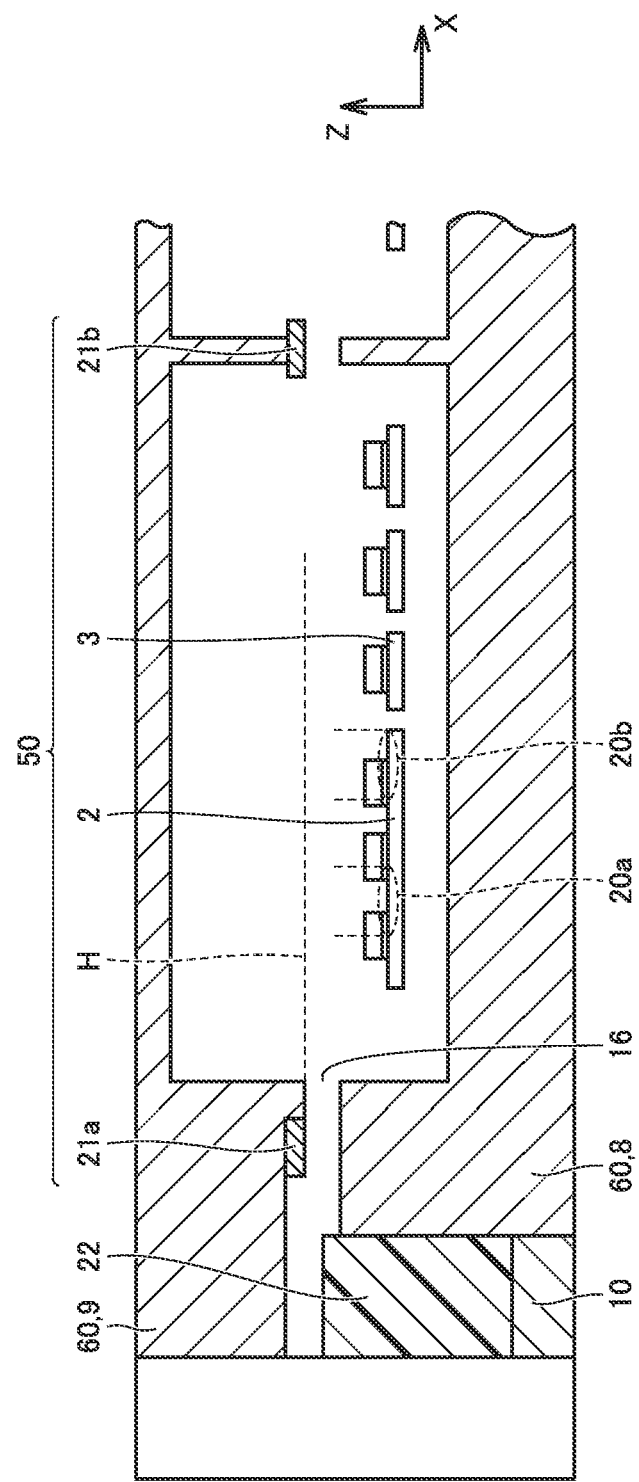
FIG. 6 is a cross sectional view showing a step performed after the step shown in FIG. 5 in the embodiment.

Next, the transfer mold method is employed to seal the power semiconductor devices using the molding resin. As shown in FIG. 6, a mold 60 having a lower mold 8 and an upper mold 9 is prepared. Between lower mold 8 and upper mold 9, lead frame 50 having power semiconductor elements 5a and the like mounted thereon is disposed.

Resin introduction opening 16 is provided in mold 60. Resin introduction opening 16 is provided below (Z axis direction) dummy lead 21a. That is, resin introduction opening 16 is disposed below (Z axis direction) a location H of each of power lead 12, power lead terminal 1a, protruding lead 15a and the like, which are located at the same height as that of dummy lead 21a. Moreover, resin introduction opening 16 is disposed, on the side of lead frame 50 on which large die pad 2 is located, at the location (see FIG. 2) from which the resin is introduced toward lead stepped portion 7 and the like in the X axis direction.

Figure 7:
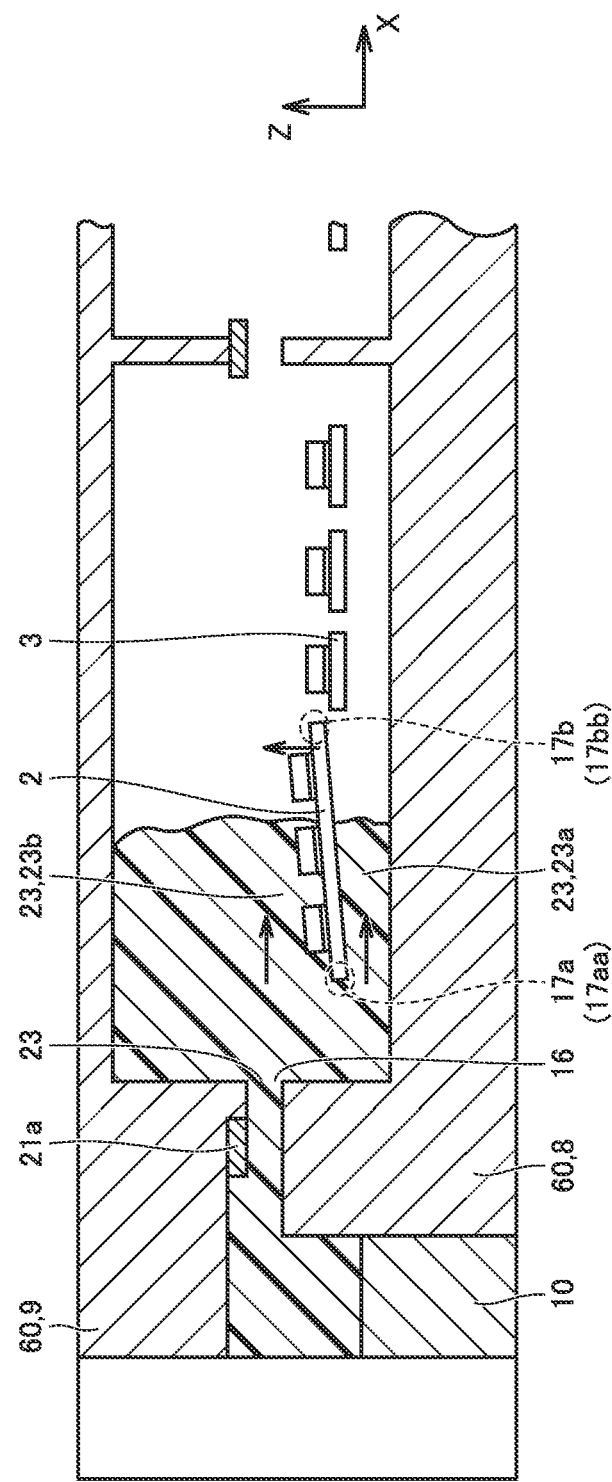
FIG. 7 is a cross sectional view showing a step performed after the step shown in FIG. 6 in the embodiment.

A tablet resin 22 is provided in mold 60. Moreover, a plunger 10 for pushing out tablet resin 22 is disposed. As shown in FIG. 7, by raising plunger 10 while melting tablet resin 22 after closing the mold with lower mold 8 and upper mold 9, melted flowable resin 23 to serve as molding resin 11 is introduced from resin introduction opening 16 into mold 60.

On this occasion, since resin introduction opening 16 is disposed below dummy lead 21a, a distance from resin introduction opening 16 to the bottom of lower mold 8 becomes shorter than that in a case of a comparative example described later. This facilitates providing flowable resin 23a to a region between large die pad 2 and the bottom of lower mold 8. Accordingly, a difference becomes small between a rate of flowable resin 23 flowing below large die pad 2 in the X axis direction (positive direction) and a rate of flowable resin 23 flowing above large die pad 2 in the X axis direction (positive direction).

Moreover, a region (cross sectional area) below large die pad 2 between large die pad 2 and the bottom of lower mold 8 is narrower than the region (cross sectional area) above large die pad 2. This leads to increased force of pushing up large die pad 2 by flowable resin 23b flowing below large die pad 2, with the result that large die pad 2 is changed to orient upward (see an upward arrow) such that the second end portion 17bb side is higher than the first end portion 17aa side on which termination portion 20a is located in large die pad 2. That is, large die pad 2 is inclined such that the height (Z axis direction) may become higher from the first end portion 17aa side toward the second end portion 17bb side.

Here, considering a case where large die pad 2 and the like are changed to orient downward, it has been known that large die pad 2 and the like are changed to orient downward immediately after the flowable resin reaches the tips of large die pad 2 and the like, with the result that the flowable resin is prevented from being provided to below large die pad 2 and the like. Hence, in order to efficiently provide flowable resin 23a to the region below large die pad 2 and the like, it is desirable to provide resin introduction opening 16 for introduction of flowable resin 23 at a location close to termination portion 20a of lead stepped portion 7 at which large die pad 2 and the like are less likely to be changed in orientation.

It is desirable to provide resin introduction opening 16 for introduction of flowable resin 23 at a location close to termination portions 20a, 20b of lead stepped portions 7 relative to one large die pad 2 and three small die pads 3 disposed sequentially along the X axis direction. Further, the location of resin introduction opening 16 in the Y axis direction is desirably close to the locations of termination portions 20a, 20b in the Y axis direction.

Moreover, resin introduction opening 16 does not remain in the power semiconductor device and needs to be efficiently removed upon gate breaking. Therefore, it is desirable to provide resin introduction opening 16 at location H adjacent to and just below dummy lead 21a (see FIG. 6).

Figure 8:
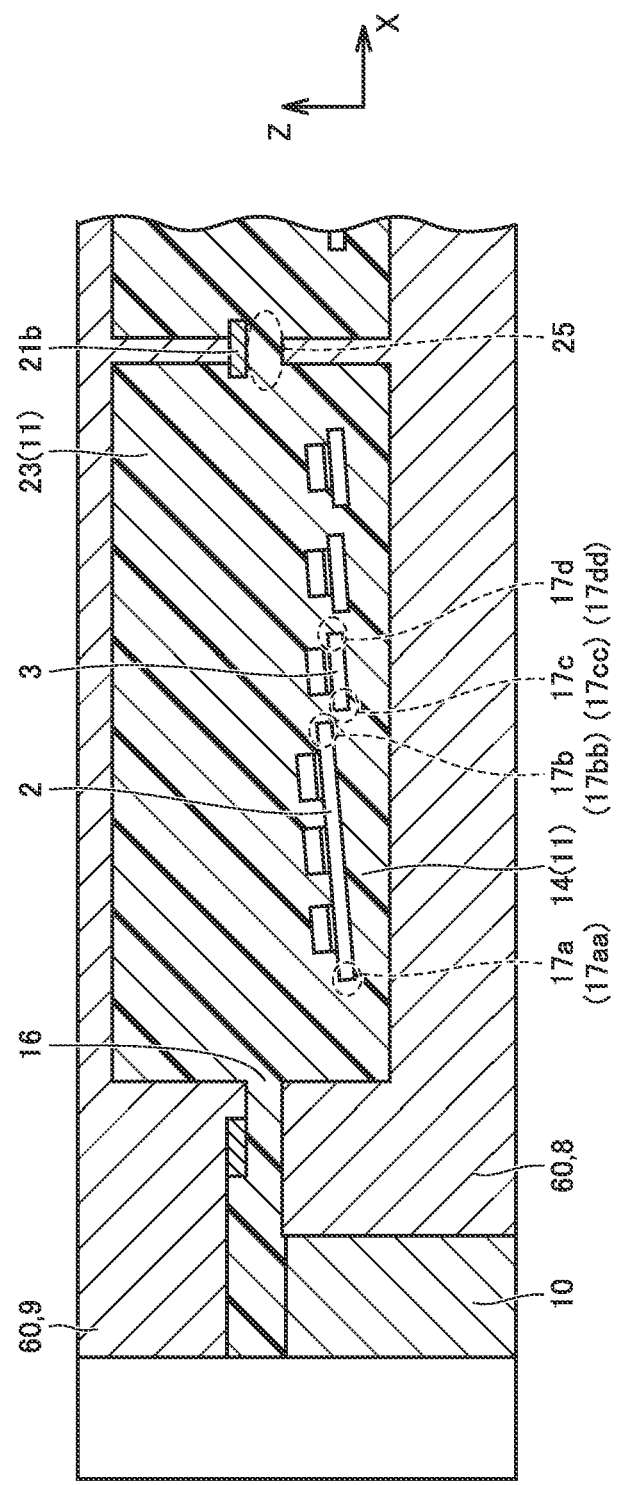
FIG. 8 is a cross sectional view showing a step performed after the step shown in FIG. 7 in the embodiment.

Accordingly, as shown in FIG. 8, flowable resin 23 is provided into mold 60 by introducing flowable resin 23 from resin introduction opening 16. As shown in FIG. 8, large die pad 2 is inclined relative to the XY plane such that the second end portion 17bb (tip 17b) side of large die pad 2 is at a higher location (Z axis direction) than the first end portion 17aa (tip 17a) side on which termination portion 20a (see FIG. 6) of lead stepped portion 7a is located.

Moreover, small die pad 3 is inclined relative to the XY plane such that the fourth end portion 17dd (tip 17d) side of small die pad 3 is at a higher location (Z axis direction) than the third end portion 17cc side on which termination portion 20b of lead stepped portion 7b is located.

Figure 9:
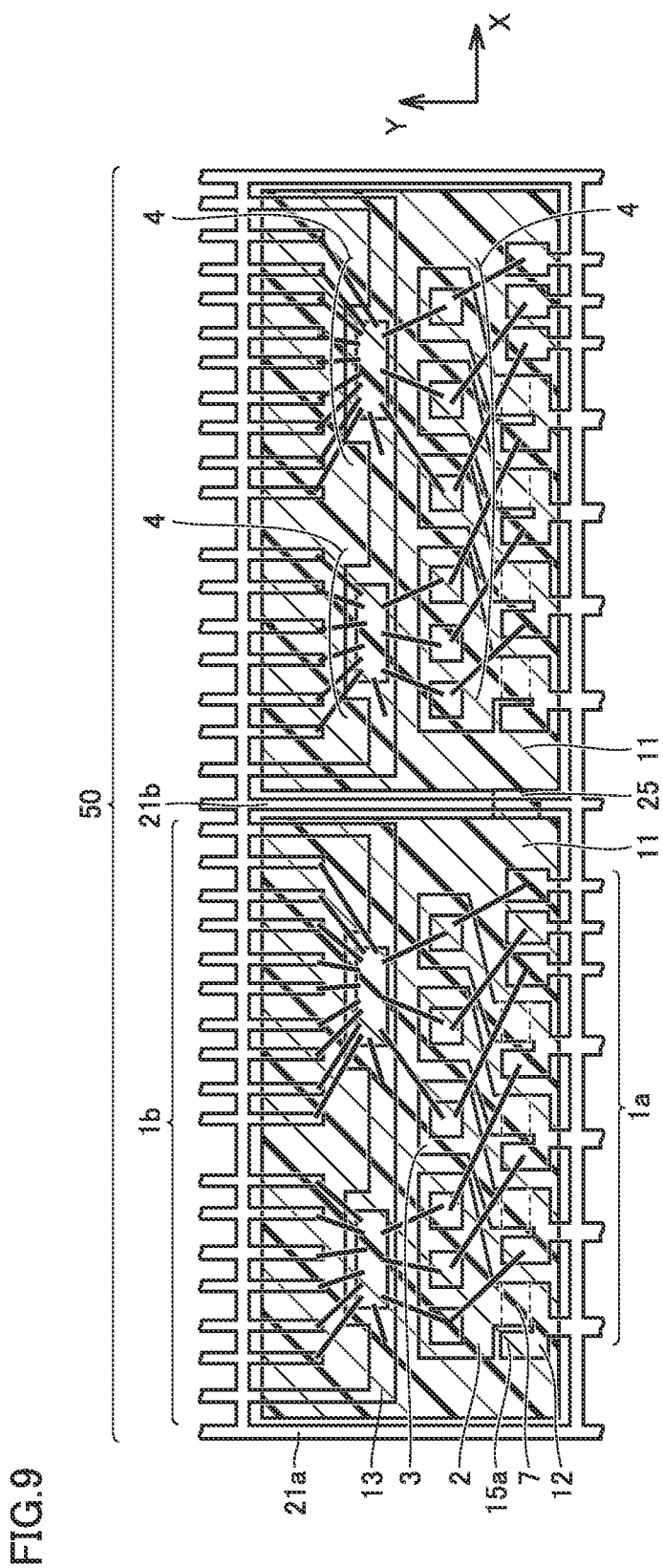
FIG. 9 is a plan view showing a step performed after the step shown in FIG. 8 in the embodiment.
Figure 10:
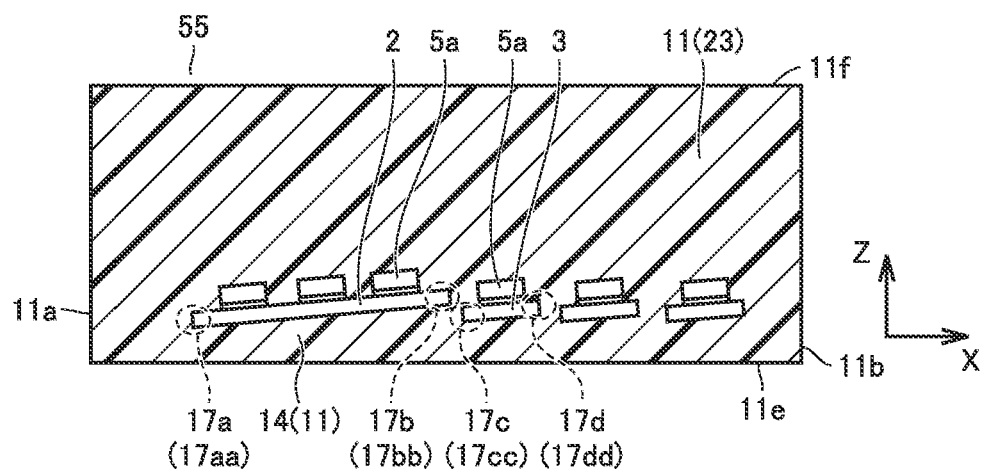
FIG. 10 is a cross sectional view showing a step performed after the step shown in FIG. 9 in the embodiment.

After flowable resin 23 is cured, the power semiconductor devices having power semiconductor elements 5a and the like sealed therein by molding resin 11 are removed from the mold as shown in FIG. 9. The power semiconductor devices thus removed are then separated into individual power semiconductor devices by cutting the dummy leads, a runner 25, and the like, thus completing power semiconductor device 55 as shown in FIG. 10.

In completed power semiconductor device 55, a surface of molding resin 11 at a portion from which a runner or the like remaining at the location corresponding to resin introduction opening 16 such as runner 25 has been removed is a rougher surface (gate trace) than the surface of molding resin 11 having been located in mold 60 (see FIG. 8). That is, from the external appearance of completed power semiconductor device 55, the location of resin introduction opening 16 (see FIG. 1) can be known.

In completed power semiconductor device 55, the thickness of molding resin 11 (thickness of insulating layer 14) covering the side of large die pad 2 opposite to the side of large die pad 2 on which power semiconductor element 5a is mounted is thicker in the positive X axis direction. Moreover, the thickness of molding resin 11 (thickness of insulating layer 14) covering the side of small die pad 3 opposite to the side of small die pad 3 on which power semiconductor element 5a is mounted is thicker in the positive X axis direction.

In the method for manufacturing the power semiconductor device described above, an electric insulation property can be secured. This will be explained in comparison with a method for manufacturing a power semiconductor device according to a comparative example. It should be noted that for ease of description, the same members are given the same reference characters in the comparative example.

Figure 11:
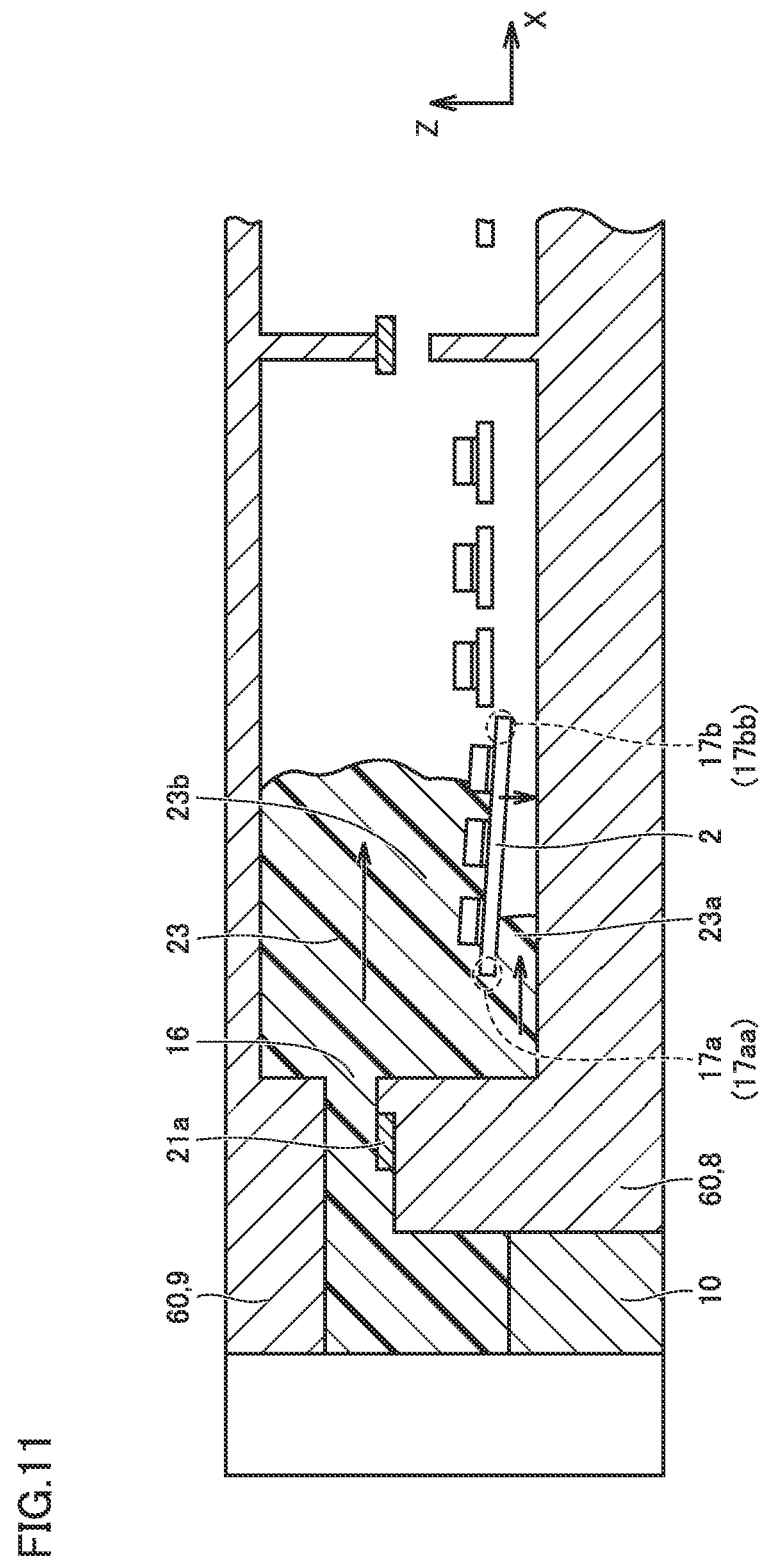
FIG. 11 is a cross sectional view showing one step of a method for manufacturing a power semiconductor device according to one comparative example.

As shown in FIG. 11, in the method for manufacturing the power semiconductor device according to the comparative example, resin introduction opening 16 is located above (Z axis direction) dummy lead 21a. That is, resin introduction opening 16 is disposed above (Z axis direction) the location of the power lead or the power lead terminal (both not shown), which are located at the same height as that of dummy lead 21a.

In this case, a flowable resin 23b of flowable resin 23 introduced from resin introduction opening 16 flows above large die pad 2 at a rate faster than a rate of a flowable resin 23a flowing below large die pad 2, with the result that flowable resin 23b is provided more quickly at the side above large die pad 2 than that at the side therebelow.

This leads to increased force of pushing down large die pad 2 by flowable resin 23b flowing above large die pad 2, with the result that large die pad 2 is changed to orient downward (see a downward arrow) from the upstream side toward the downstream side of the flow of flowable resin 23b in large die pad 2 such that tip 17b is lower than tip 17a. Accordingly, the thickness of molding resin 11 covering the side of large die pad 2 opposite to the side of large die pad 2 on which power semiconductor element 5a is mounted becomes thinner in the X axis positive direction, with the result that the electric insulation property may be decreased.

Figure 12:
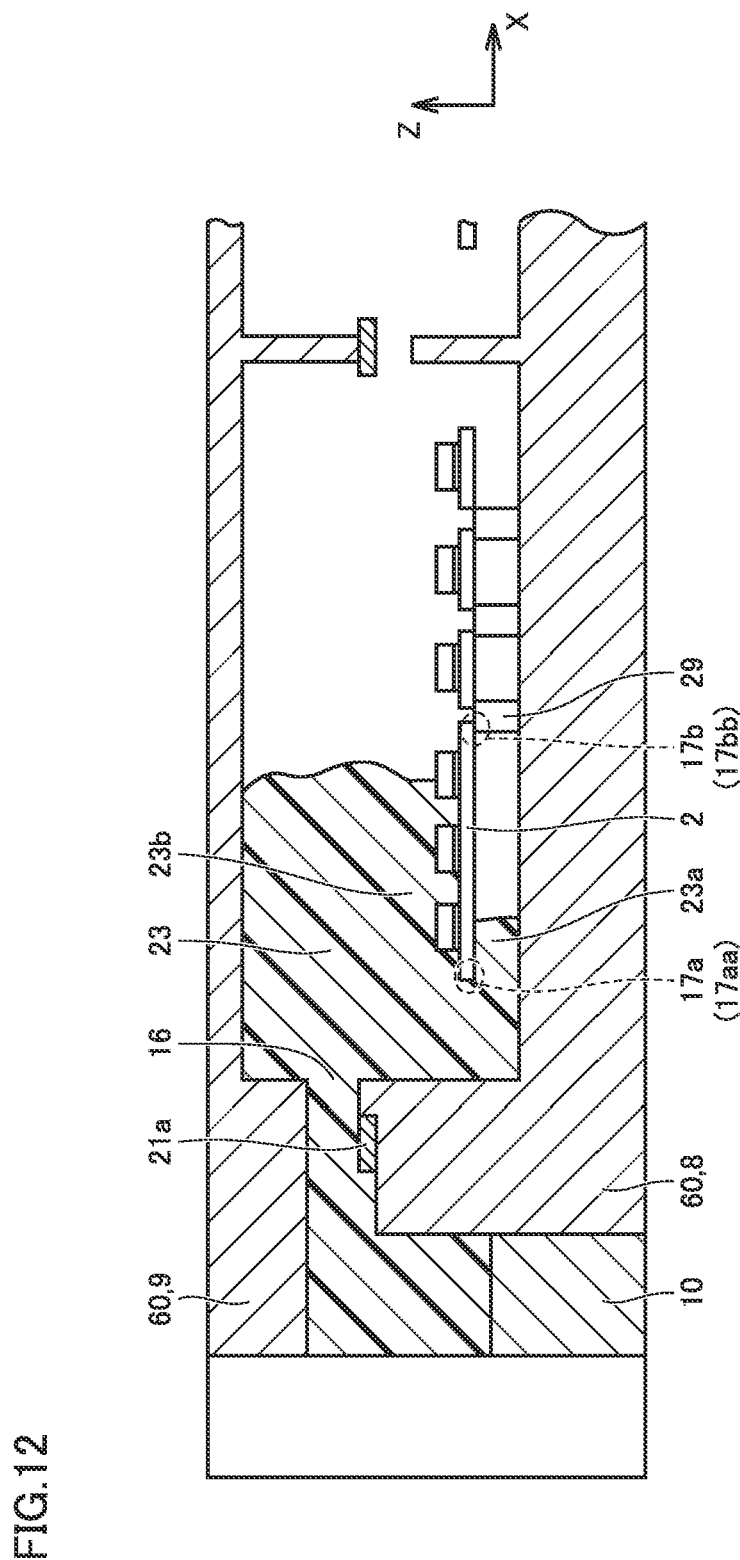
FIG. 12 is a cross sectional view showing a step for improving the method for manufacturing the power semiconductor device according to the one comparative example shown in FIG. 11.

As a method for preventing large die pad 2 from being changed to orient downward, for example, a movable pin 29 can be installed below large die pad 2 and the like so as to support large die pad 2 and the like from below as shown in FIG. 12, thereby preventing large die pad 2 from being changed to orient downward. In this method, movable pin 29 is pulled out after completing introduction of flowable resin 23.

As compared with the method for manufacturing the power semiconductor device according to the comparative example, in the method for manufacturing the power semiconductor device according to the first embodiment, resin introduction opening 16 is disposed below dummy lead 21a as shown in FIG. 6. Accordingly, a distance from resin introduction opening 16 to the bottom of lower mold 8 becomes shorter than that in the case of the comparative example, whereby flowable resin 23a (see FIG. 7) is facilitated to be provided to the region between large die pad 2 and the bottom of lower mold 8.

Accordingly, force of pushing up large die pad 2 becomes strong by flowable resin 23a flowing below large die pad 2, with the result that large die pad 2 is inclined such that the height (Z axis direction) thereof is higher from the first end portion 17aa side on which termination portion 20a of lead stepped portion 7a is located toward the second end portion 17bb side (see FIG. 7).

Moreover, force of pushing up small die pad 3 becomes strong by flowable resin 23b flowing below small die pad 3, with the result that small die pad 3 is inclined such that the height (Z axis direction) thereof is higher from the third end portion 17cc side on which termination portion 20b of lead stepped portion 7b is located toward the fourth end portion 17dd side (see FIG. 8).

Figure 13:
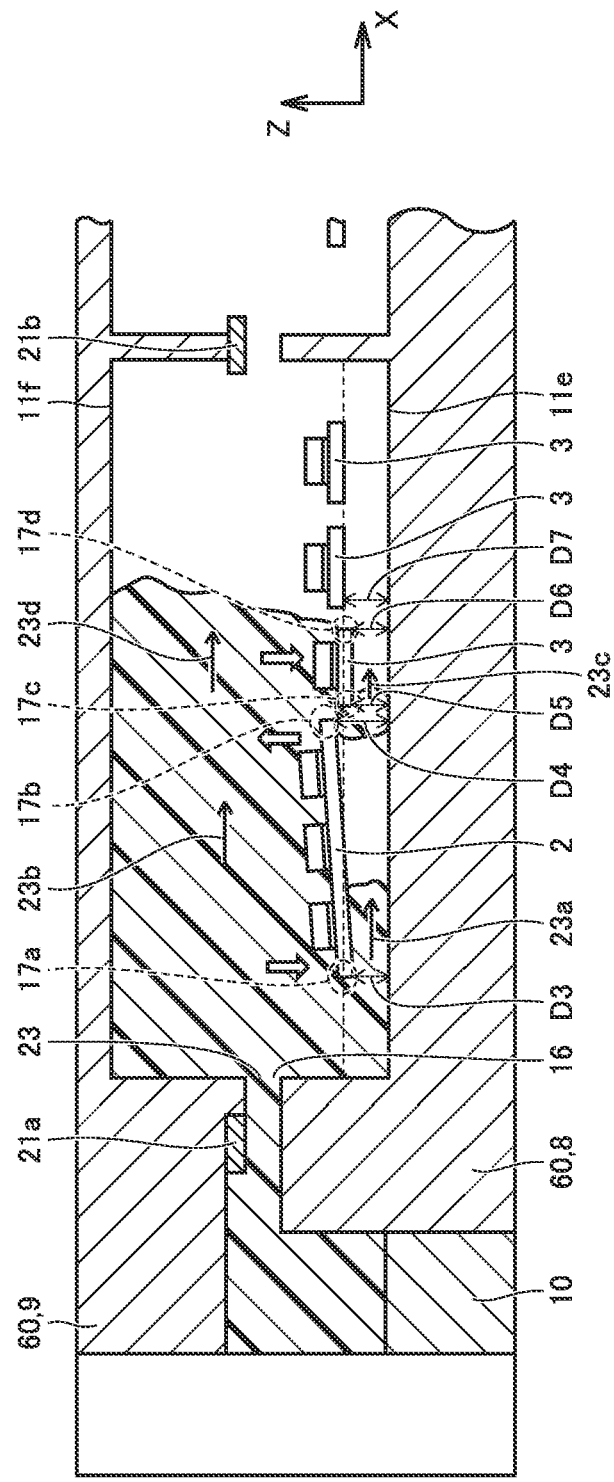
FIG. 13 is a cross sectional view showing a first state after the step shown in FIG. 7 in the embodiment so as to explain function and effect.

Further, the following describes the arrangement and insulation property of small die pad 3 more in detail. Since small die pad 3 has a smaller area as a die pad than that of large die pad 2, the inclination of small die pad 3 is smaller than the inclination of large die pad 2. FIG. 13 shows a state in which flowable resin 23 is further provided from the state shown in FIG. 7. As shown in FIG. 13, a flowable resin 23d flowing above small die pad 3 is provided faster than a flowable resin 23c flowing below small die pad 3.

Accordingly, downward force is first exerted onto small die pad 3 by flowable resin 23d, and small die pad 3 is not returned fully to the upper side by the force exerted upward by flowable resin 23c flowing below small die pad 3, with the result that upon completion of the provision of flowable resin 23, each of a distance D5 between first main surface 11e and the end portion at which tip 17c of small die pad 3 is located and a distance D6 between first main surface 11e and the end portion at which tip 17d is located may become shorter than a distance D7 between small die pad 3 and first main surface 11e before providing flowable resin 23.

Figure 14:
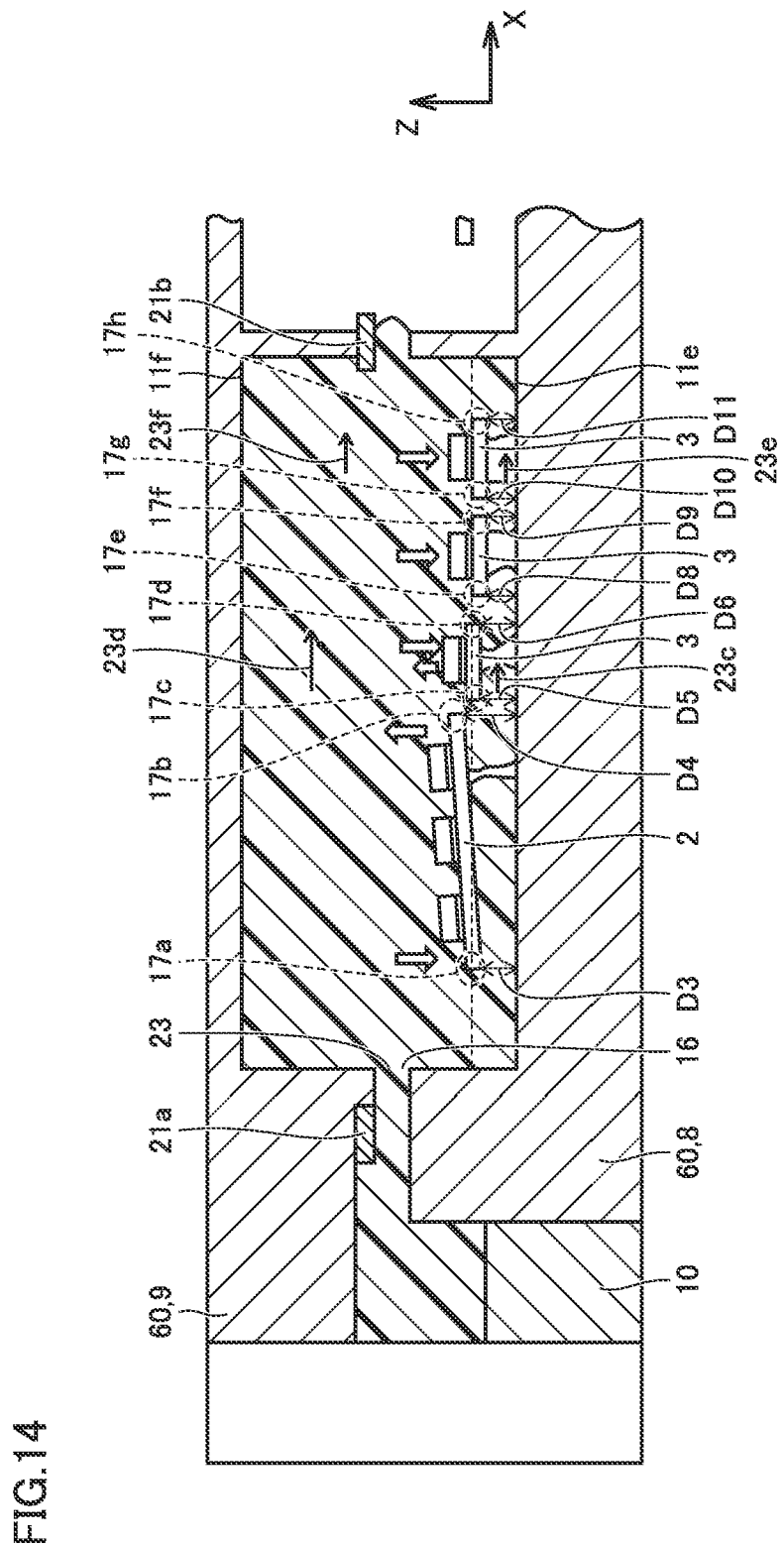
FIG. 14 is a cross sectional view showing a second state after the first state in the embodiment so as to explain function and effect.
Figure 15:
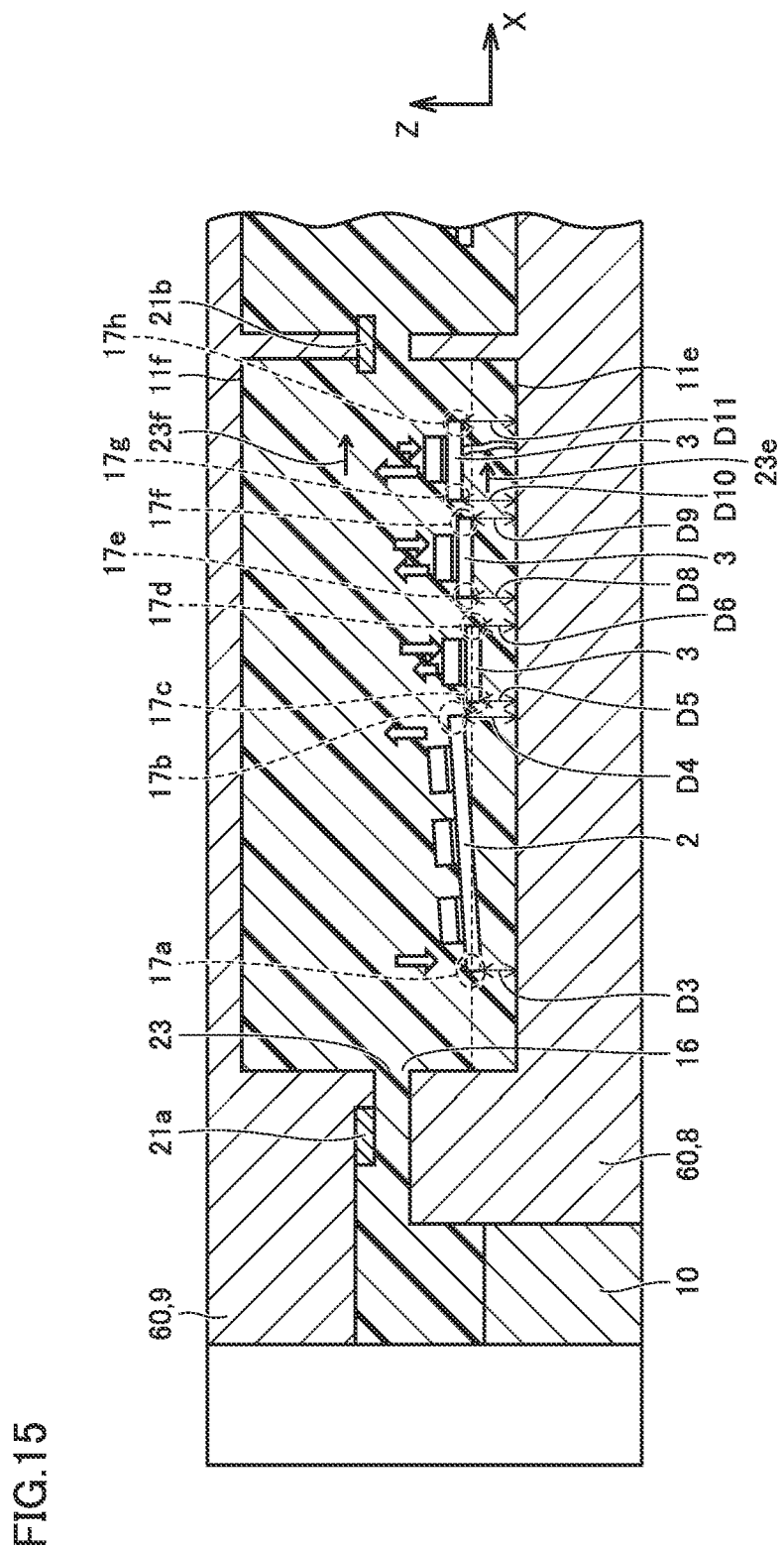
FIG. 15 is a cross sectional view showing a third state after the second state in the embodiment so as to explain function and effect.

Next, FIG. 14 and FIG. 15 show respective states in which flowable resin 23 is sequentially provided from the state shown in FIG. 13. By flowable resins 23d, 23f flowing above each small die pad 3, small die pad 3 is first changed to orient in the −z direction. Then, by flowable resins 23c, 23e flowing below each small die pad 3, force is exerted onto small die pad 3 in the +Z direction. Since the viscosity of flowable resin 23 is increased with passage of time, the viscosity of flowable resin 23 becomes higher as flowable resin 23 is further away from resin introduction opening 16. As the viscosity is higher, the force exerted onto small die pad 3 becomes larger.

Here, it is assumed that a distance D8 represents a distance between first main surface 11e and the end portion at which tip 17e of small die pad 3 is located, in the state in which flowable resin 23 is provided. It is assumed that a distance D9 represents a distance between first main surface 11e and the end portion at which tip 17f of small die pad 3 is located. It is assumed that a distance D10 represents a distance between first main surface 11e and the end portion at which tip 17g of small die pad 3 is located. It is assumed that a distance D11 represents a distance between first main surface 11e and the end portion at which tip 17h of small die pad 3 is located (see FIG. 15). Hence, as shown in FIG. 15, at the time of completion of the provision of flowable resin 23, distance D5 distance D6<distance D8 distance D9<distance D10 distance D11 is satisfied. Therefore, the electric insulation property can be secured even in the state shown in FIG. 15 in which the provision of the flowable resin has been completed.

Since each of large die pad 2 and small die pad 3 is inclined in this way, the thickness of molding resin 11 (thickness of insulating layer 14) covering the side of large die pad 2 opposite to the side of large die pad 2 on which power semiconductor element 5a is mounted becomes thicker in the positive X axis direction. Moreover, the thickness of molding resin 11 (thickness of insulating layer 14) covering the side of small die pad 3 opposite to the side of small die pad 3 on which power semiconductor element 5a is mounted becomes thicker in the positive X axis direction. As a result, the electric insulation property of power semiconductor device 55 can be secured.

It should be noted that depending on a variation in a manner of flow of flowable resin 23, distance D5 distance D6, distance D8 distance D9, distance D10 distance D11, distance D6>distance D8 and distance D9>distance D10 may be satisfied. Also in that case, a distance between adjacent small die pads 3 becomes long, thereby improving the electric insulation property.

Moreover, in the above-described method for manufacturing the power semiconductor device, since resin introduction opening 16 is disposed on the side on which dummy lead 21a is located, a yield of the material can be improved as compared with a case where resin introduction opening 16 is disposed on the side on which power lead terminal 1a and the like are located.

Figure 16:
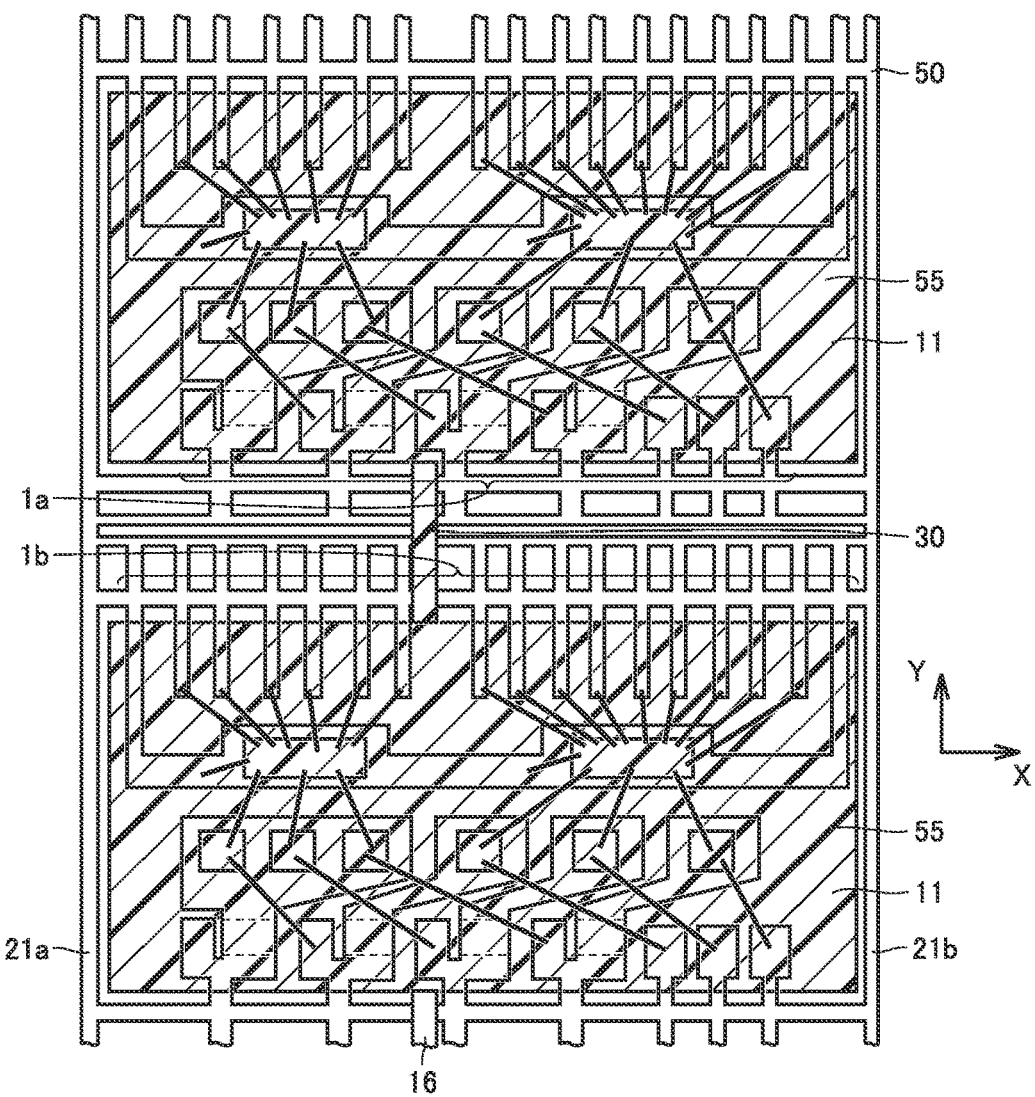
FIG. 16 is a plan view showing one step of a method for manufacturing a power semiconductor device according to another comparative example.

As shown in FIG. 16, for example, the following case is considered: resin introduction opening 16 is disposed on the side on which power lead terminal 1a is located. In this case, lead frame 50 is formed in such a manner that the portion of lead frame 50 to be power lead terminal 1a and the portion of lead frame 50 to be IC lead terminal 1b are joined to each other.

In the case of such a lead frame 50, at the time of completion of sealing by molding resin 11, molding resin 11 for sealing one power semiconductor device 55 and molding resin 11 for sealing the other power semiconductor device 55 are joined to each other by a runner 30. The one power semiconductor device 55 and the other power semiconductor device 55 are adjacent to each other. The length (Y axis direction) of runner 30 is longer than the total of the length (Y axis direction) of power lead terminal 1a and the length (Y axis direction) of IC lead terminal 1b. Runner 30 is a portion to be discarded. Hence, a large amount of the material for molding resin 11 is wasted, thus resulting in a deteriorated yield of the material.

On the other hand, in the above-described method for manufacturing the power semiconductor device, since resin introduction opening 16 is disposed on the side on which dummy lead 21a is located, the length of runner 25 becomes a length substantially corresponding to the width of dummy lead 21b as shown in FIG. 9. Accordingly, the material for molding resin 11 is suppressed from being wasted, thus suppressing a deteriorated yield of the material.

Moreover, in order to avoid collapse of wire 4 by introduced flowable resin 23, the arrangement relation of resin introduction opening 16 in the above-described method for manufacturing the power semiconductor device is more suitable for manufacturing of a small power semiconductor device than manufacturing of a large power semiconductor device. For example, the method for manufacturing the power semiconductor device is suitable for manufacturing of a small power semiconductor device having a package called "SOP (Small Outline Package)" or "DIP (Dual Inline Package)". By disposing resin introduction opening 16 on the side on which dummy lead 21a is located and introducing the flowable resin in the X axis direction, the yield of the material for molding resin 11 can be improved. Moreover, since the plurality of semiconductor devices are sealed simultaneously, a cycle time of the process can be short.

Figure 17:
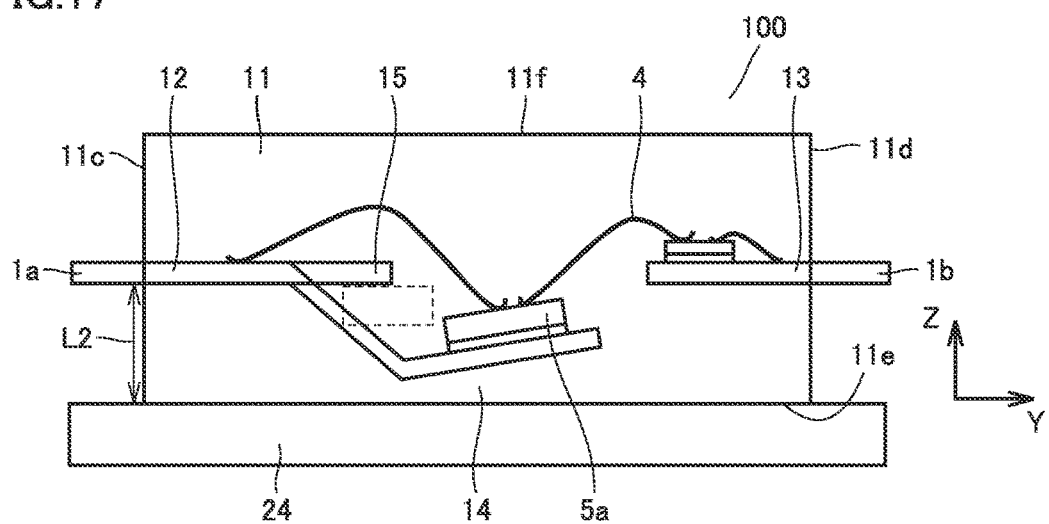
FIG. 17 is a cross sectional view of the power semiconductor device in the embodiment so as to explain function and effect.

Further, in power semiconductor device 55 described above, the electric insulation property can be improved by securing a creepage distance. As shown in FIG. 17, as a manner of use of power semiconductor device 55, power semiconductor device 55 may be attached to a cooling fin 24 to promote heat dissipation. In such a manner of use, it is necessary to secure a creepage distance L2 between power lead terminal 1a and cooling fin 24 composed of a metal.

In power semiconductor device 55, each of large die pad 2 and small die pad 3 on which power semiconductor elements 5a are mounted is disposed on the first main surface 11e side of molding resin 11 relative to the location (Z axis direction) at which power lead terminal 1a and the like are disposed. That is, creepage distance L2 can be secured while securing heat dissipation by providing a necessary minimum thickness of molding resin 11 (thickness of insulating layer 14) covering the respective sides of large die pad 2 and small die pad 3 opposite to the respective sides of large die pad 2 and small die pad 3 on which power semiconductor elements 5a are mounted. Accordingly, the electric insulation property can be improved. By securing creepage distance L2, a larger amount of current can be provided to power lead terminal 1a.

Moreover, in the positional relation with IC lead 13 (IC lead terminal 1b), each of large die pad 2 and the like is disposed at a location (Z axis direction) lower than IC lead 13. IC element 5b mounted on IC lead 13 generates a smaller amount of heat than that of power semiconductor element 5a. Hence, in consideration of the creepage distance, it is more desirable for IC lead 13 to be distant away from first main surface 11e of molding resin 11. On the other hand, large die pad 2 and the like on which power semiconductor elements 5a are mounted are desirably located close to first main surface 11e.

Moreover, in power semiconductor device 55 described above, protruding lead 15a is provided in power lead 12 joined to large die pad 2 via lead stepped portion 7. Moreover, protruding leads 15b, 15c, 15d are provided in power leads 12 joined to small die pads 3 via lead stepped portions 7.

Hence, flowable resin 23 introduced from resin introduction opening 16 flows above and below protruding leads 15a to 15d, whereby protruding leads 15a to 15d are fixed by flowable resin 23 provided above and below protruding leads 15a to 15d. Accordingly, power leads 12 joined to protruding leads 15a to 15d are also fixed.

Accordingly, large die pad 2 joined to power lead 12 via lead stepped portion 7a can be suppressed from being changed to orient downward (Z axis direction). Moreover, small die pad 3 joined to power lead 12 via lead stepped portion 7b can be suppressed from being changed to orient downward (Z axis direction). It should be noted that the shape of protruding lead 15a may be the same as or different from the shape of each of protruding leads 15b and the like.

Particularly, the effect of suppressing large die pad 2 from being changed to orient downward can be increased by providing flowable resin 23 around protruding lead 15a before providing flowable resin 23 around large die pad 2.

Moreover, the effect of suppressing small die pad 3 from being changed to orient downward can be increased by providing flowable resin 23 around each of protruding leads 15b to 15d before providing flowable resin 23 around small die pad 3. Accordingly, as shown in FIG. 1, protruding lead 15a is desirably provided on the side on which resin introduction opening 16 is disposed relative to large die pad 2. Each of protruding leads 15b to 15d is desirably provided on the side on which resin introduction opening 16 is disposed relative to small die pad 3.

Moreover, in power semiconductor device 55 described above, wire 4 is connected to each of protruding leads 15b to 15d (see FIG. 1). Accordingly, the area of a region to which wire 4 is bonded can be secured while reducing the length of power semiconductor device 55 in the Y axis direction. Accordingly, heat generated in the region to which wire 4 is bonded can be dissipated efficiently, whereby reliability of power semiconductor device 55 can be improved. As the region to which wire 4 is bonded is larger, heat dissipation is improved more. Hence, the areas of protruding leads 15a to 15d (X axis direction and Y axis direction) are desirably larger.

Further, as the length of each of protruding leads 15b to 15d in the Y axis direction is longer, the length of wire 4 can be shorter. With such a short length of wire 4, electric resistance is decreased, thereby suppressing generation of heat at the region to which wire 4 is bonded. The suppressed generation of heat leads to improved reliability of power semiconductor device 55.

Moreover, when introducing flowable resin 23 into the mold, a phenomenon of wire 4 being collapsed by flowable resin 23 takes place. On this occasion, as the length of wire 4 is shorter, wire 4 is less likely to be collapsed. Accordingly, for example, an electric short circuit can be suppressed from taking place due to collapse of wire 4, thus resulting in an improved electric insulation property. The reliability of power semiconductor device 55 can be improved.

Second Embodiment

Figure 18:
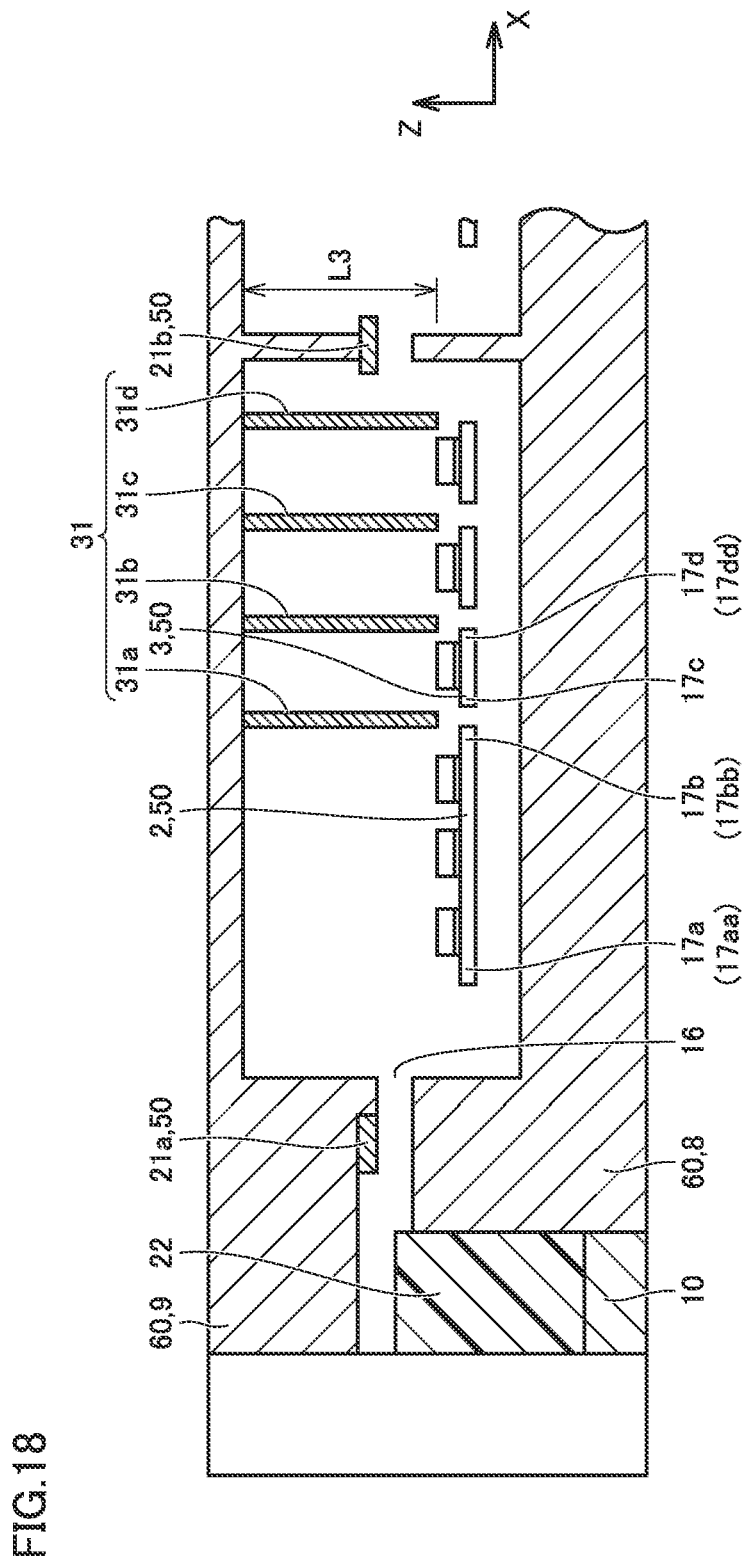
FIG. 18 is a cross sectional view showing one step of a method for manufacturing the power semiconductor device according to a second embodiment of the present invention.

Here, the following describes another exemplary method for manufacturing the power semiconductor device. First, after the same steps as the above-described steps shown in FIG. 5 and FIG. 6, lead frame 50 having power semiconductor elements 5a and the like mounted thereon is disposed in mold 60 as shown in FIG. 18. Next, after closing the mold with lower mold 8 and upper mold 9, movable pins 31 provided in upper mold 9 are moved down. As movable pins 31, four movable pins 31a, 31b, 31c, 31d are provided. Movable pin 31a corresponds to a first pin member, whereas each of movable pins 31b corresponds to a second pin member. Movable pin 31a is moved down by a length L3 just above second end portion 17bb of large die pad 2 with a space being interposed therebetween. Movable pin 31b is moved down by length L3 just above fourth end portion 17dd of small die pad 2 with a space being interposed therebetween. Each of movable pins 31c, 31d is also moved down by length L3 in the same manner.

Figure 19:
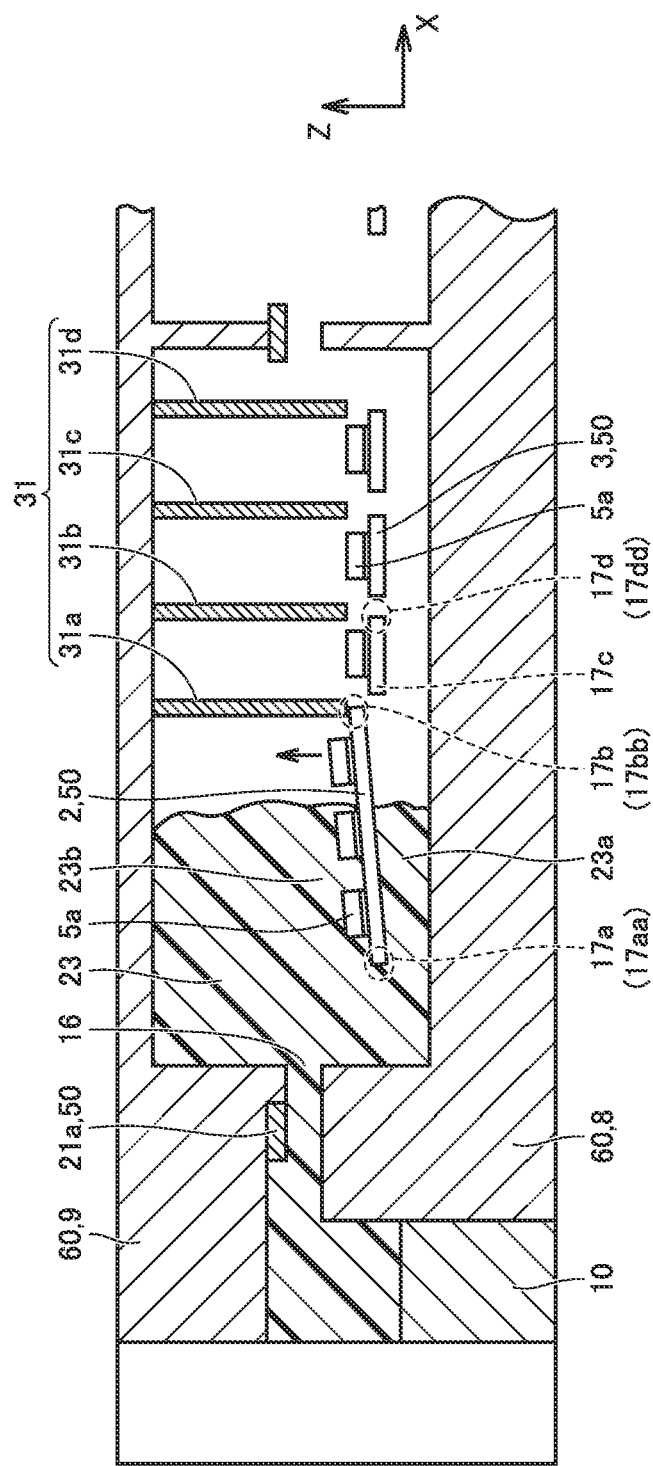
FIG. 19 is a cross sectional view showing a step performed after the step shown in FIG. 18 in the embodiment.

Next, as shown in FIG. 19, by raising plunger 10 while melting tablet resin 22, melted flowable resin 23 to serve as molding resin 11 is introduced from resin introduction opening 16 into mold 60. On this occasion, since resin introduction opening 16 is disposed below dummy lead 21a as described in the first embodiment, flowable resin 23a is facilitated to be provided at the region between large die pad 2 and the bottom of lower mold 8.

By flowable resin 23a flowing below large die pad 2, the force of pushing up large die pad 2 becomes strong, with the result that large die pad 2 is changed to orient upward (see an upward arrow) such that the second end portion 17bb side is higher than the first end portion 17aa side. On this occasion, since movable pin 31a is disposed just above second end portion 17bb of large die pad 2 with a space being interposed therebetween, second end portion 17bb is brought into abutment with movable pin 31a, whereby large die pad 2 can be prevented from being inclined too much. Moreover, as with large die pad 2, fourth end portion 17dd in each small die pad 3 is also brought into abutment with movable pin 31b, whereby small die pad 3 can be prevented from being inclined too much.

Figure 20:
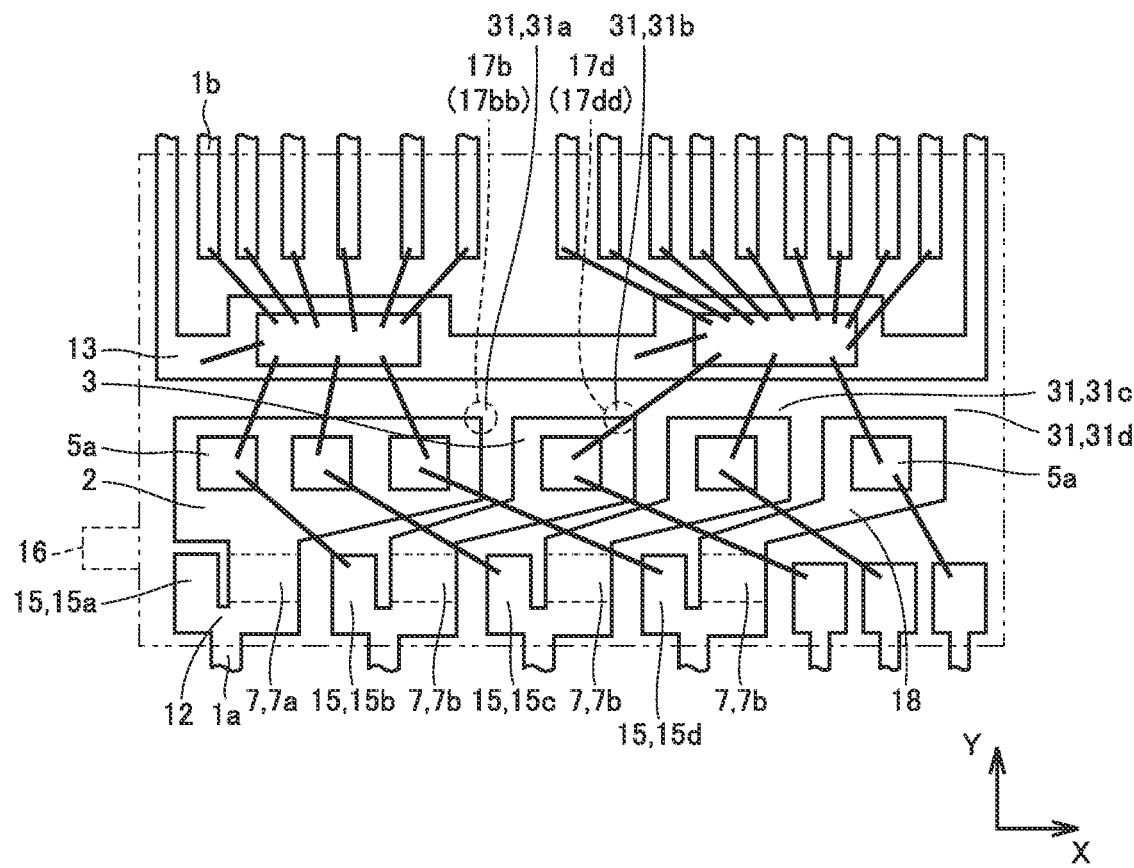
FIG. 20 is a plan view showing locations of movable pins in the step shown in FIG. 19 in the embodiment.

FIG. 20 shows the locations of movable pins 31 when the power semiconductor device is seen in a plan view. As shown in FIG. 20, for example, movable pin 31a is desirably disposed at second end portion 17bb of large die pad 2 including tip 17b. Moreover, movable pin 31b is desirably disposed at fourth end portion 17dd of small die pad 3 including tip 17d. Moreover, movable pins 31 are desirably disposed at locations to avoid contact with wires 4. Further, before introducing flowable resin 23, movable pin 31a is desirably disposed at a height location to avoid contact with large die pad 2. Moreover, movable pin 31b is desirably disposed at a height location to avoid contact with small die pad 3 (see FIG. 18).

After providing flowable resin 23 in mold 60, each movable pin 31 is pulled out. Flowable resin 23 flows into portions from which movable pins 31 have been pulled out. A smaller diameter of movable pin 31 is more desirable in order to suppress large die pad 2 and small die pad 3 from being changed in orientation when flowable resin 23 flows thereinto. Moreover, in order to secure the strength of movable pin 31, the movable pin desirably has a diameter of about 2 mm.

Figure 21:
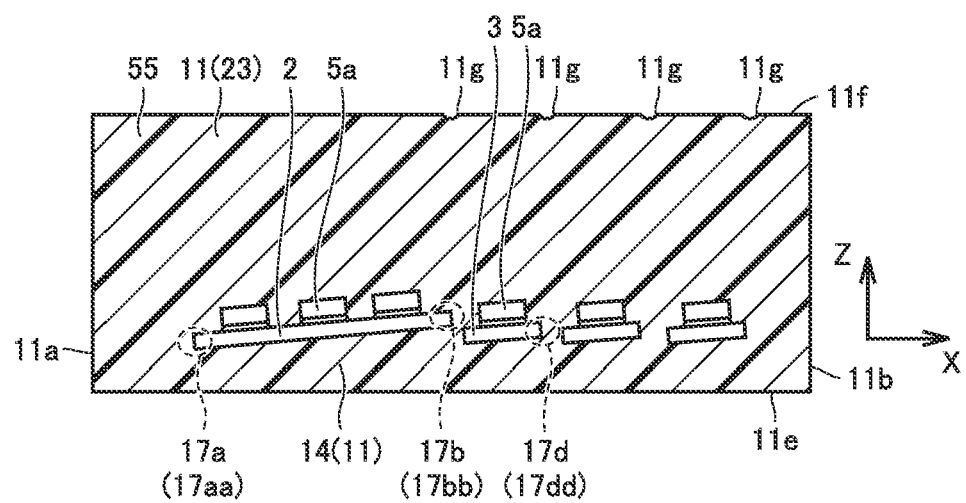
FIG. 21 is a cross sectional view showing a step performed after the step shown in FIG. 20 in the embodiment.

After flowable resin 23 is cured, the power semiconductor devices having power semiconductor elements 5a and the like sealed by molding resin 11 are removed from mold 60. The power semiconductor devices thus removed are separated into individual power semiconductor devices by cutting the dummy leads, thus completing power semiconductor device 55 as shown in FIG. 21. In this power semiconductor device 55, second main surface 11f of molding resin 11 is provided with recesses 11g at the portions from which movable pins 31 have been pulled out.

In the above-described method for manufacturing the power semiconductor device according to the second embodiment, the following effect is obtained in addition to the effect described in the first embodiment. That is, by adjusting length L3 by which movable pins 31 protrude, respective amounts of changes of large die pad 2 and small die pads 3 in orientation can be adjusted in accordance with a specification and the like of power semiconductor element 5a and the like while changing each of large die pad 2 and small die pads 3 to be inclined upward. It should be noted that each of large die pad 2 and small die pads 3 is inclined upward as described in the first embodiment even in the case where large die pad 2 or small die pads 3 is/are not brought into contact with movable pins 31 when providing flowable resin 23.

Third Embodiment

Figure 22:
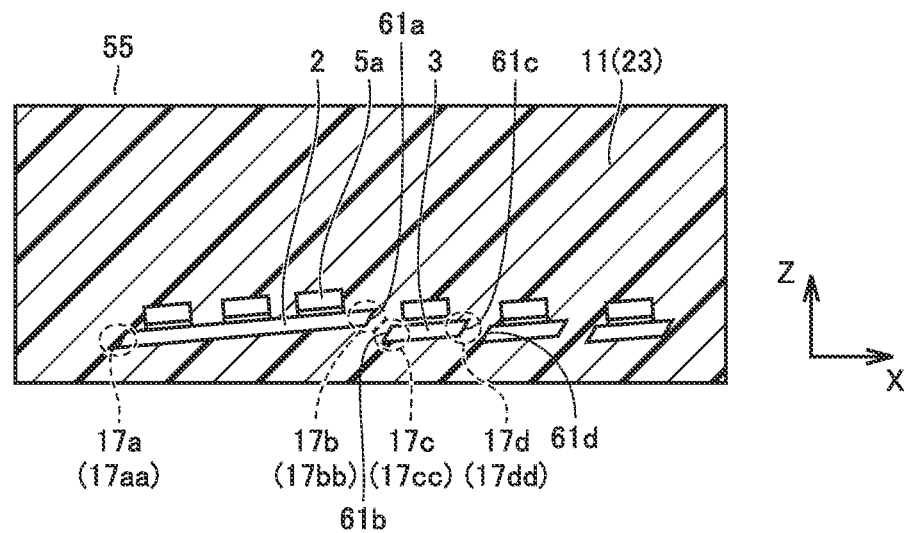
FIG. 22 is a cross sectional view of a power semiconductor device according to a third embodiment of the present invention.
Figure 23:
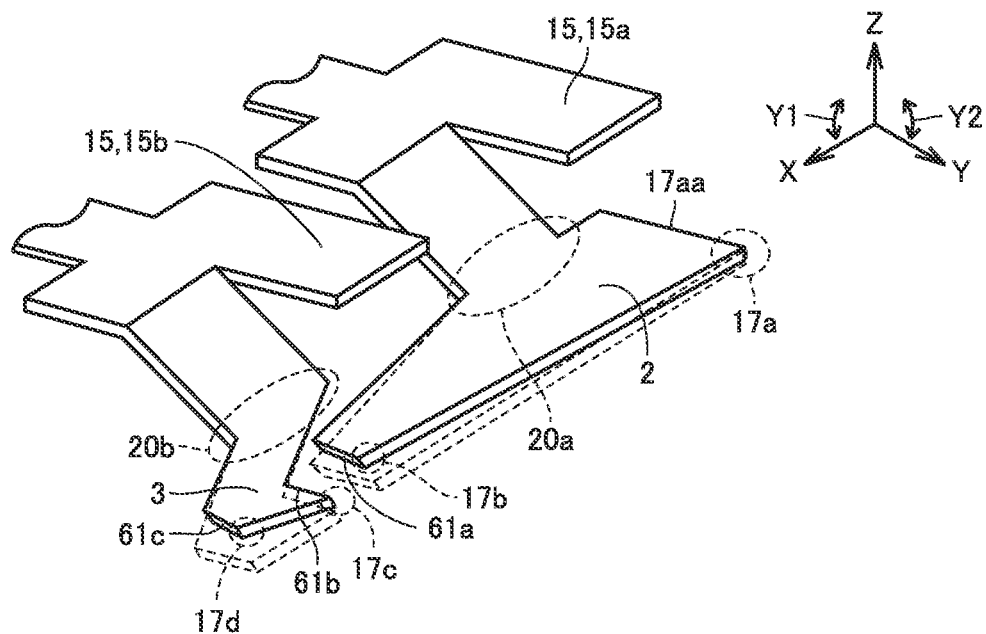
FIG. 23 is a partial perspective view for illustrating an arrangement relation between the large die pad and the small die pad in the embodiment.

FIG. 22 shows a cross sectional structure of power semiconductor device 55 according to a third embodiment. Moreover, FIG. 23 shows a structure of each of portions of large die pad 2 and small die pad 3 in power semiconductor device 55 in an enlarged manner. A tapered portion 61a is provided at an end portion at which tip 17b of large die pad 2 is located. A tapered portion 61b is provided at an end portion at which tip 17c of small die pad 3 is located. A tapered portion 61c is provided at an end portion at which tip 17d of small die pad 3 is located.

By inclining each of tapered portion 61a and tapered portion 61b in a desired direction, it is desirable to secure a long space between large die pad 2 and small die pad 3. For example, tapered portion 61a is formed to be inclined, toward the −X direction side, from above to below (from the +Z direction to the −Z direction). For example, tapered portion 61b is formed to be inclined, toward the −X direction side, from above to below (from the +Z direction to the −Z direction). It should be noted that for example, tapered portion 61b may be formed to be inclined, toward the +X direction side, from above to below (from the +Z direction to the −Z direction). A taper angle of each of tapered portion 61a and tapered portion 61b is desirably about 45°. Each of tapered portion 61a and tapered portion 61b can be formed by polishing the lead frame, for example.

Figure 24:
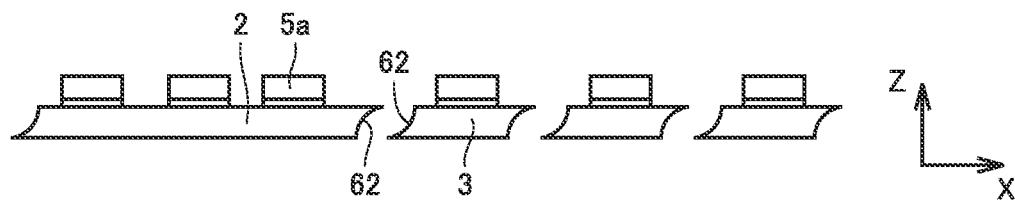
FIG. 24 is a cross sectional view showing respective side surfaces of the large die pad and small die pad in the embodiment.

Moreover, as shown in FIG. 24, a curved portion 62 may be provided at each of the end portions of large die pad 2 and small die pad 3 facing each other. Curved portion 62 has a shape resulting from each of large die pad 2 and small die pad 3 being recessed in the vicinity of its center in the thickness direction. By providing curved portion 62 at each of large die pad 2 and small die pad 3, a longer distance between large die pad 2 and small die pad 3 than that in the case of each of tapered portions 61a, 61b can be secured. This can contribute to downsizing of a power semiconductor module as long as the same breakdown voltage is maintained.

Figure 25:
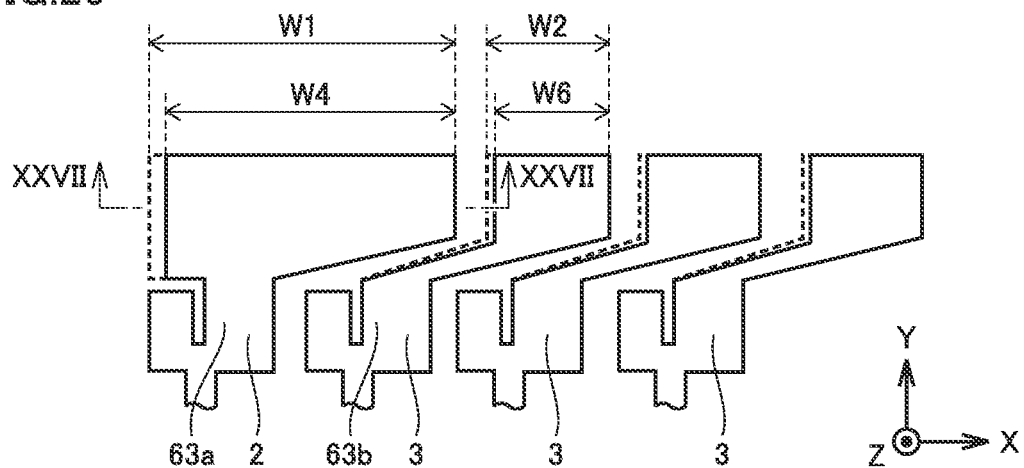
FIG. 25 is a first partial plan view for illustrating a method for forming shapes of the large die pad and small die pad through an etching step in the embodiment.
Figure 26:
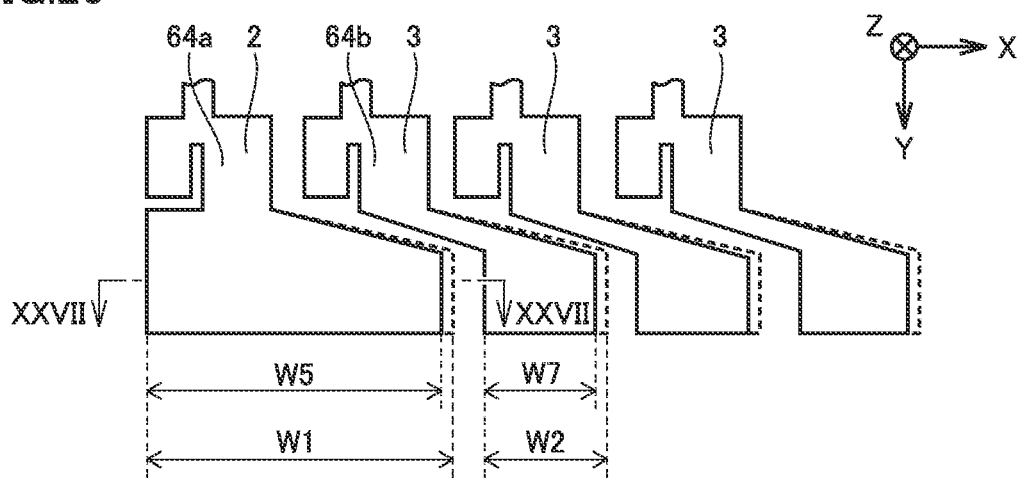
FIG. 26 is a second partial plan view for illustrating the method for forming the shapes of the large die pad and small die pad through the etching step in the embodiment.

Next, the following describes a method for forming curved portion 62 at each of large die pad 2 and small die pad 3. FIG. 25 shows a plan view (X-Y plane) in a state in which an etching mask 63a is adhered to the upper surface of large die pad 2 and an etching mask 63b is adhered to the upper surface of small die pad 3. In FIG. 25, the forward side of the plane of sheet corresponds to the +Z direction. FIG. 26 shows a plan view (X-Y plane) in a state in which an etching mask 64a is adhered to the lower surface of large die pad 2 and an etching mask 64b is adhered to the lower surface of small die pad 3. In FIG. 26, the backward side of the plane of sheet corresponds to the +Z direction.

Width W4 of etching mask 63a in the X direction is narrower than width W1 of large die pad 2 in the X direction. Width W5 of etching mask 64a in the X direction is narrower than width W1 of the large die pad in the X direction. Width W6 of etching mask 63b in the X direction is narrower than width W2 of small die pad 3 in the X direction. Width W7 of etching mask 64b in the X direction is narrower than width W2 of small die pad 3 in the X direction.

Figure 27:
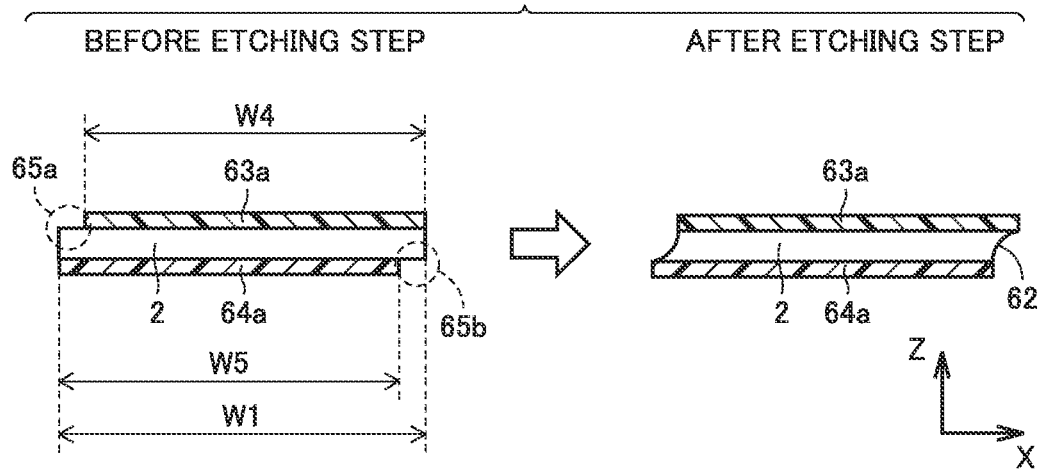
FIG. 27 is a partial cross sectional view for illustrating the method for forming the shapes of the large die pad and small die pad through the etching step in the embodiment.

FIG. 27 shows respective cross sectional structures (X-Z plane) of large die pad 2 before and after an etching step. Before the etching step, the upper surface of large die pad 2 has a portion 65a not covered with etching mask 63a as shown in the left-side diagram of FIG. 27. Moreover, the lower surface of large die pad 2 has a portion 65b not covered with etching mask 64a. Portion 65a not covered with etching mask 63a and portion 65b not covered with etching mask 64a are cut by etching.

In this way, as shown in the right-side diagram of FIG. 27, curved portion 62 is formed at the end portion of large die pad 2. Similarly, curved portion 62 is formed also at the end portion of small die pad 3 (see FIG. 24). Then, after the same steps as those shown in FIG. 6 to FIG. 8, a power semiconductor device having curved portions 62 formed therein is manufactured.

In power semiconductor device 55 described above, since tapered portions 61a, 61b or curved portions 62 are formed, a longer distance between large die pad 2 and small die pad 3 than that in a structure in which tapered portions 61a, 61b or curved portions 62 are not formed can be secured. Accordingly, a distance L1 (see FIG. 1) between large die pad 2 and small die pad 3 can be short as long as the breakdown voltage is the same. With such a short distance L1, the length of wire 4 become short to reduce electric resistance, thereby suppressing generation of heat at the region to which wire 4 is bonded. The suppressed generation of heat leads to improved reliability of power semiconductor device 55.

Moreover, by providing tapered portions 61a, 61b or curved portions 62, a contact area between molding resin 11 and large die pad 2 and a contact area between molding resin 11 and small die pad 3 become larger than those in the structure in which tapered portions 61a, 61b or curved portions 62 are not formed. Accordingly, adhesion between molding resin 11 and large die pad 2 and adhesion between molding resin 11 and small die pad 3 are improved, thereby improving reliability of power semiconductor device 55. Further, curved portions 62 have larger surface areas than those of tapered portions 61a, 61b, thereby further improving the adhesion with molding resin 11.

Fourth Embodiment

Here, the following describes a power conversion device to which the power semiconductor device described in the first or second embodiment described above is applied. Although the present invention is not limited to a specific power conversion device, the following describes a case where the present invention is applied to a three-phase inverter as a third embodiment.

Figure 28:
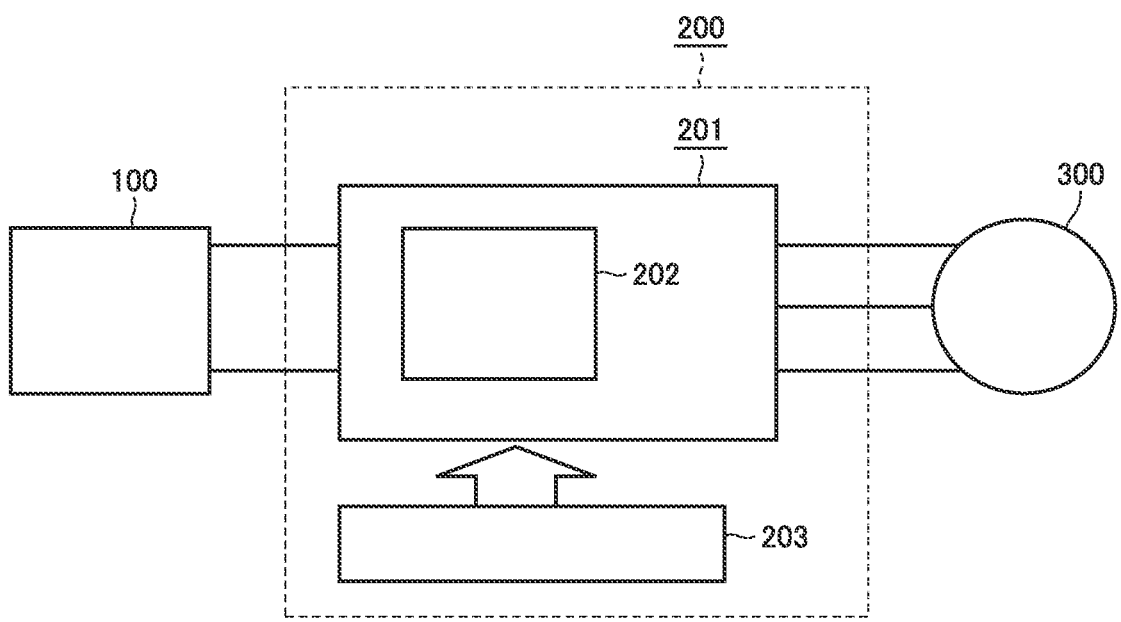
FIG. 28 is a block diagram of a power conversion device to which the power semiconductor device is applied according to a fourth embodiment of the present invention.

FIG. 28 is a block diagram showing a configuration of a power conversion system to which the power conversion device according to the present embodiment is applied. The power conversion system shown in FIG. 28 is constituted of a power supply 100, a power conversion device 200, and a load 300. Power supply 100 is a DC power supply and supplies DC power to power conversion device 200. Power supply 100 can be constructed using various components such as a DC system, a solar cell, and a rechargeable battery. On the other hand, power supply 100 may be constructed using a rectifier circuit or AC/DC converter connected to an AC system. Moreover, power supply 100 may be constructed using a DC/DC converter to convert, into predetermined power, the DC power output from the DC system.

Power conversion device 200 is a three-phase inverter connected between power supply 100 and load 300, converts the DC power supplied from power supply 100 into AC power, and supplies the AC power to load 300. As shown in FIG. 28, power conversion device 200 includes: a main conversion circuit 201 to convert DC power into AC power and output the AC power; and a control circuit 203 to output, to main conversion circuit 201, a control signal for controlling main conversion circuit 201.

Load 300 is a three-phase motor to drive using the AC power supplied from power conversion device 200. It should be noted that load 300 is not limited to a specific application, is a motor mountable on various types of electric devices, and is used as a motor for a hybrid vehicle, an electric vehicle, a railroad vehicle, an elevator, or an air conditioner, for example.

Hereinafter, details of power conversion device 200 will be described. Main conversion circuit 201 includes a switching element and a reflux diode (both not shown). By switching the switching element, the DC power supplied from power supply 100 is converted into AC power, and the AC power is supplied to load 300. Although there are various types of specific circuit configurations for main conversion circuit 201, main conversion circuit 201 according to the present embodiment is a two-level, three-phase full bridge circuit and can be constituted of six switching elements and six reflux diodes connected to the respective switching elements in anti-parallel.

In at least one of each switching element and each reflux diode of main conversion circuit 201, power semiconductor device 55 according to the first or second embodiment described above is configured as a semiconductor module 202. Each two of the six switching elements constitute upper and lower arms connected in series, and the upper and lower arms constitute a corresponding phase (U phase, V phase, or W phase) of the full bridge circuit. Moreover, the output terminals of the upper and lower arms, i.e., the three output terminals of main conversion circuit 201 are connected to load 300.

Moreover, main conversion circuit 201 includes a drive circuit (not shown) to drive each switching element; however, the drive circuit may be provided in semiconductor module 202 or may be provided to be separated from semiconductor module 202. The drive circuit generates a driving signal for driving a switching element of main conversion circuit 201, and supplies it to a control electrode of the switching element of main conversion circuit 201. Specifically, in accordance with a control signal from control circuit 203, a driving signal for bringing a switching element into an ON state and a driving signal for bringing a switching element into an OFF state are output to respective control electrodes of the switching elements. When a switching element is maintained to be in the ON state, the driving signal is a voltage signal (ON signal) that is more than or equal to a threshold voltage of the switching element. When a switching element is maintained to be in the OFF state, the driving signal is a voltage signal (OFF signal) that is less than or equal to the threshold voltage of the switching element.

Control circuit 203 controls a switching element of main conversion circuit 201 to supply desired power to load 300. Specifically, a time (ON time) at which each switching element of main conversion circuit 201 is to be ON is calculated based on the power to be supplied to load 300. For example, main conversion circuit 201 can be controlled through PWM control for modulating the ON time of the switching element in accordance with the voltage to be output. Further, a control command (control signal) is output to the drive circuit included in main conversion circuit 201 so as to output an ON signal to a switching element to be ON at a corresponding time and output an OFF signal to a switching element to be OFF at a corresponding time. The drive circuit outputs the ON signal or the OFF signal to the control electrode of each switching element as a driving signal in accordance with this control signal.

In the power conversion device according to the present embodiment, since power semiconductor device 55 according to the first or second embodiment described above is applied as semiconductor module 202 to at least one of each switching element and each reflux diode of main conversion circuit 201, the electric insulation property can be improved, thereby improving the reliability of the power conversion device.

In the present embodiment, it has been illustratively described that the present invention is applied to the two-level three-phase inverter; however, the present invention is not limited to this and can be applied to various power conversion devices. In the present embodiment, the two-level power conversion device is employed; however, the power conversion device may be a three-level or multilevel power conversion device, or the present invention may be applied to a single-phase inverter when power is supplied to a single-phase load. Moreover, when power is supplied to a DC load or the like, the present invention can be also applied to a DC/DC converter or an AC/DC converter.

Moreover, the power conversion device to which the present invention is applied is not limited to one in which the above-described load is a motor, can be also used as, for example, a power supply device of an electrical discharge machining device, a laser machining device, an induction heating cooking device, or a contactless power feeding system, and can be further used as a power conditioner in a photovoltaic power system, a power storage system, or the like.

It should be noted that the power semiconductor devices described in the embodiments can be combined in various manners as required. Moreover, for dependent claims in the scope of claims for patent, dependent forms corresponding to the combination are also intended to be included.

The embodiments disclosed herein are illustrative and non-restrictive. The scope of the present invention is defined by the terms of the claims, rather than the embodiments described above, and is intended to include any modifications within the scope and meaning equivalent to the terms of the claims.

INDUSTRIAL APPLICABILITY

The present invention is effectively used for a power semiconductor device including a lead frame having a die pad on which a semiconductor element is mounted.

REFERENCE SIGNS LIST

1$a$: power lead terminal; 1$b$: IC lead terminal; 2: large die pad; 3: small die pad; 4: wire; 5$a$: power semiconductor element; 5$b$: IC element; 6$a$, 6$b$, 6$c$: electrically conductive adhesive agent; 7$a$, 7$b$: lead stepped portion; 8: lower mold; 9: upper mold; 10: plunger; 11: molding resin; 11$a$: first side portion; 11$b$: second side portion; 11$c$: third side portion; 11$d$: fourth side portion; 11$e$: first main surface; 11$f$: second main surface; 11$g$: recess; 12: power lead; 13: IC lead; 14: insulating layer; 15, 15$a$, 15$b$, 15$c$, 15$d$: protruding lead; 16: resin introduction opening; 17$a$, 17$b$, 17$c$, 17$d$, 17$e$, 17$f$, 17$g$, 17$h$: tip; 17$aa$: first end portion; 17$bb$: second end portion; 17$cc$: third end portion; 17$dd$: fourth end portion; 18: bent portion; 20$a$, 20$b$: termination portion; 21$a$, 21$b$: dummy lead; 22: tablet resin; 23, 23$a$, 23$b$: flowable resin; 24: heat dissipation fin; 25, 30: runner; 27: resin provision space; 29: movable pin; 31, 31$a$, 31$b$: movable pin; 50: lead frame; 55: power semiconductor device; 60: mold; 61$a$, 61$b$, 61$c$, 61$d$: tapered portion; 62: curved portion; 63$a$, 63$b$, 64$a$, 64$b$: etching mask; 65$a$, 65$b$: portion; L1: distance; L2: creepage distance; L3: protruding length; W1: width of large die pad; W2: width of small die pad; W3: width of bent portion; D1, D2: distance; C1, C2: central line; W4, W5, W6, W7: width.

The invention claimed is:

1. A power semiconductor device comprising:
a lead terminal;
a first die pad;
a first semiconductor element mounted on the first die pad;
a first hanging lead connected to the first die pad and joined to the lead terminal; and
a sealing material to seal the first die pad, the first semiconductor element, and the first hanging lead so as to expose a portion of the lead terminal, wherein
the first die pad has a first end portion and a second end portion located with a first distance between the first end portion and the second end portion in a first direction,
in a second direction crossing the first direction, the first hanging lead is connected to the first die pad on the first end portion side relative to a center between the first end portion and the second end portion in the first die pad,
the first die pad is disposed on a side on which a first main surface of the sealing material is located relative to a first location in a third direction, the first main surface covering a side of the first die pad opposite to a side of the first die pad on which the first semiconductor element is mounted, the third direction crossing the first direction and the second direction, the first location being a location at which the lead terminal is located, and
the first die pad is inclined such that a thickness of the sealing material from a portion of the sealing material on the side of the first die pad opposite to the side of the first die pad on which the first semiconductor element is mounted to the first main surface is thicker from the first end portion side of the first die pad toward the second end portion side of the first die pad,
the power semiconductor device further comprising:
a second die pad;
a second semiconductor element mounted on the second die pad; and
a second hanging lead connected to the second die pad and joined to the lead terminal, wherein 'the second die pad has a third end portion and a fourth end portion located with a second distance between the third end portion and the fourth end portion in the first direction,
in the second direction, the second hanging lead is connected to the second die pad on the third end portion side relative to a center between the third end portion and the fourth end portion in the second die pad,
the second die pad is disposed on a side on which the first main surface of the sealing material is located relative to the first location in the third direction, the first main surface covering a side of the second die pad opposite to a side of the second die pad on which the second semiconductor element is mounted, the first location being a location at which the lead terminal is located,
the second die pad is inclined such that a thickness of the sealing material from a portion of the sealing material on the side of the second die pad opposite to the side of the second die pad on which the second semiconductor element is mounted to the first main surface is thicker from the third end portion side of the second die pad toward the fourth end portion side of the second die pad,
the first die pad has a first width in the first direction,
the second die pad has a second width in the first direction, the second width being shorter than the first width,
the sealing material includes a first side portion and a second side portion facing each other with a third distance between the first side portion and the second side portion in the first direction, the third distance being longer than the first distance,
the first die pad is disposed on the first side portion side, and
the second die pad is disposed on the second side portion side relative to the first die pad.

2. The power semiconductor device according to claim 1, comprising a first protruding lead that protrudes from the lead terminal in the second direction at the first location at which the lead terminal is located, wherein
the first protruding lead is disposed on the first end portion side of the first die pad relative to the first hanging lead.

3. The power semiconductor device according to claim 1, wherein the first die pad is inclined such that the thickness of the sealing material from the portion of the sealing material on the side of the first die pad opposite to the side of the first die pad on which the first semiconductor element is mounted to the first main surface of the sealing material is thicker toward a side further away in the second direction from a side on which the first die pad is connected to the first hanging lead.

4. The power semiconductor device according to claim 1, wherein
the second die pad includes a bent portion bent to have a first direction component extending in the first direction, and a second direction component extending in the second direction, and
the bent portion is connected to the second hanging lead.

5. The power semiconductor device according to claim 1, comprising a second protruding lead that protrudes from the lead terminal in the second direction at the first location at which the lead terminal is located, wherein
the second protruding lead is disposed on the third end portion side of the second die pad relative to the second hanging lead.

6. The power semiconductor device according to claim 1, wherein the second die pad is inclined such that the thickness of the sealing material from the portion of the sealing material on the side of the second die pad opposite to the side of the second die pad on which the second semiconductor element is mounted to the first main surface of the sealing material is thicker toward a side further away in the second direction from a side on which the second die pad is connected to the second hanging lead.

7. The power semiconductor device according to claim 1, comprising:
a third die pad; and
a third semiconductor element mounted on the third die pad, wherein
the sealing material includes
a third side portion and a fourth side portion facing each other with a fourth distance between the third side portion and the fourth side portion in the second direction, and
a second main surface facing the first main surface,
the first die pad is disposed along the third side portion,
the third die pad is disposed along the fourth side portion, and
the third die pad is disposed on the second main surface side relative to the first die pad.

8. The power semiconductor device according to claim 1, wherein a tapered portion is provided at each of end portions of the first die pad and the second die pad facing each other.

9. The power semiconductor device according to claim 1, wherein a curved portion is provided at each of end portions of the first die pad and the second die pad facing each other.

10. A method for manufacturing a power semiconductor device, the method comprising:
forming a lead frame;
mounting a first semiconductor element on the lead frame;
disposing the lead frame in a mold such that a side of the lead frame on which the first semiconductor element is mounted orients upward, the mold being provided with a lower mold, an upper mold, and a sealing material introduction opening;
introducing a sealing material from the sealing material introduction opening into the mold; and
removing the mold, wherein
the forming of the lead frame includes
forming a lead terminal, a first die pad, and a first hanging lead,
the first die pad having a first end portion and a second end portion located with a first distance between the first end portion and the second end portion in a first direction, the first semiconductor element being mounted on the first die pad,
in a second direction crossing the first direction, the first hanging lead being connected to the first die pad on the first end portion side relative to a center between the first end portion and the second end portion in the first die pad, the first hanging lead being joined to the lead terminal, and
disposing the first die pad at a location lower than a first location in a third direction by performing a bending process onto the first hanging lead, the first location being a location at which the lead terminal is located, the third direction crossing the first direction and the second direction,
in the disposing of the lead frame in the mold, the sealing material introduction opening is disposed below the first location at a location from which the sealing material is introduced toward the first hanging lead in the first direction,
in the introducing of the sealing material into the mold, the sealing material introduced from the sealing material introduction opening into the mold includes a first sealing material portion provided between the first die pad and the lower mold, and a second sealing material portion provided between the first die pad and the upper mold,
when providing the first sealing material portion and the second sealing material portion, the first die pad is inclined such that the second end portion side of the first die pad orients upward relative to the first end portion side of the first die pad due to the second end portion side of the first die pad being pushed up by the first sealing material portion relative to the first end portion side of the first die pad, the first hanging lead being connected to the first end portion side of the first die pad.

11. The method for manufacturing the power semiconductor device according to claim 10, wherein
the forming of the lead frame includes forming a first protruding lead that protrudes from the lead terminal in the second direction and that is disposed on the first end portion side of the first die pad relative to the first hanging lead, and
in the disposing of the lead frame in the mold, the sealing material introduction opening is disposed below the first protruding lead when seen in the first direction.

12. The method for manufacturing the power semiconductor device according to claim 10, wherein
in the introducing of the sealing material into the mold,
before introducing the sealing material into the mold, a first pin member is disposed on the second end portion side of the first die pad from above the first die pad so as to avoid contact with the first die pad, and
the first pin member is pulled out after providing the sealing material in the mold.

13. The method for manufacturing the power semiconductor device according to claim 10, wherein
the forming of the lead frame includes
forming a second die pad and a second hanging lead,
the second die pad having a third end portion and a fourth end portion located with a second distance between the third end portion and the fourth end portion in the first direction, a second semiconductor element being mounted on the second die pad, the second die pad being located on a side opposite to the sealing material introduction opening relative to the first die pad,
in the second direction, the second hanging lead being connected to the second die pad on the third end portion side relative to a center between the third end portion and the fourth end portion in the second die pad, the second hanging lead being joined to the lead terminal, and
disposing the second die pad at a location lower than the first location in the third direction by performing a bending process onto the second hanging lead, the first location being a location at which the lead terminal is located, and
in the introducing of the sealing material into the mold, when providing the first sealing material portion and the second sealing material portion, the second die pad is inclined such that the fourth end portion side of the second die pad orients upward relative to the third end portion side of the second die pad due to the fourth end portion side of the second die pad being pushed up by the first sealing material portion relative to the third end portion side of the second die pad, the second hanging lead being connected to the third end portion side of the second die pad.

14. The method for manufacturing the power semiconductor device according to claim 13, wherein
the forming of the lead frame includes forming a second protruding lead that protrudes from the lead terminal in the second direction and that is disposed on the third end portion side of the second die pad relative to the second hanging lead, and
in the disposing of the lead frame in the mold, the sealing material introduction opening is disposed below the second protruding lead when seen in the first direction.

15. The method for manufacturing the power semiconductor device according to claim 13, wherein
in the introducing of the sealing material into the mold,
before introducing the sealing material into the mold, a second pin member is disposed on the fourth end portion side of the second die pad from above the second die pad so as to avoid contact with the second die pad, and
the second pin member is pulled out after providing the sealing material in the mold.

16. A method for manufacturing a power semiconductor device, the method comprising:
forming a lead frame;
mounting a first semiconductor element on the lead frame;
disposing the lead frame in a mold such that a side of the lead frame on which the first semiconductor element is mounted orients upward, the mold being provided with a lower mold, an upper mold, and a sealing material introduction opening;
introducing a sealing material from the sealing material introduction opening into the mold; and
removing the mold, wherein
the forming of the lead frame includes
forming a lead terminal, a first die pad, and a first hanging lead,
the first die pad having a first end portion and a second end portion located with a first distance between the first end portion and the second end portion in a first direction, the first semiconductor element being mounted on the first die pad,
in a second direction crossing the first direction, the first hanging lead being connected to the first die pad on the first end portion side relative to a center between the first end portion and the second end portion in the first die pad, the first hanging lead being joined to the lead terminal, and
disposing the first die pad at a location lower than a first location in a third direction by performing a bending process onto the first hanging lead, the first location being a location at which the lead terminal is located, the third direction crossing the first direction and the second direction,
in the disposing of the lead frame in the mold, the sealing material introduction opening is disposed below the first location at a location from which the sealing material is introduced toward the first hanging lead in the first direction,
the forming of the lead frame includes forming a first protruding lead that protrudes from the lead terminal in the second direction and that is disposed on the first end portion side of the first die pad relative to the first hanging lead, and
in the introducing of the sealing material into the mold, when seen in the first direction, the sealing material is introduced from the sealing material introduction opening disposed below the first protruding lead so as to incline the first die pad such that the second end portion side orients upward relative to the first end portion side.

17. A power conversion device comprising:
a main conversion circuit to convert input power and output the converted power, the main conversion circuit having the power semiconductor device recited in claim 1; and
a control circuit to output, to the main conversion circuit, a control signal for controlling the main conversion circuit.

18. The power semiconductor device according to claim 1, wherein
a gate trace remains at the first side portion in the sealing material,
the gate trace is located at the first side portion on the first main surface side relative to the first location and exists at a location facing the first hanging lead in the first direction.

* * * * *